United States Patent
Kwon et al.

(10) Patent No.: US 9,553,549 B2
(45) Date of Patent: Jan. 24, 2017

(54) HYBRID POWER AMPLIFIER HAVING ELECTRICAL AND THERMAL CONDUCTION PATH

(71) Applicant: Avago Technologies General IP (Singapore) Pte. Ltd., Singapore (SG)

(72) Inventors: Young Kwon, Thousand Oaks, CA (US); David Bockelman, Dripping Springs, TX (US); Marshall Maple, Cupertino, CA (US); Joo Min Jung, Seoul (KR)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 266 days.

(21) Appl. No.: 14/289,591

(22) Filed: May 28, 2014

(65) Prior Publication Data
US 2015/0349723 A1 Dec. 3, 2015

(51) Int. Cl.
*H03F 3/14* (2006.01)
*H03F 1/30* (2006.01)
*H03F 3/19* (2006.01)
*H03F 3/21* (2006.01)
*H03F 1/02* (2006.01)
*H03F 3/195* (2006.01)
(Continued)

(52) U.S. Cl.
CPC ............ *H03F 1/302* (2013.01); *H03F 1/0205* (2013.01); *H03F 1/0272* (2013.01); *H03F 1/301* (2013.01); *H03F 3/19* (2013.01); *H03F 3/195* (2013.01); *H03F 3/21* (2013.01); *H03F 3/245* (2013.01); *H03F 3/45085* (2013.01); *H03F 3/45475* (2013.01); *H01L 23/481* (2013.01); *H01L 2224/05554* (2013.01); *H01L 2224/16145* (2013.01); *H01L 2224/48091* (2013.01); *H01L 2224/48137* (2013.01); *H01L 2224/49175* (2013.01); *H01L 2224/73265* (2013.01); *H03F 2200/318* (2013.01); *H03F 2200/405* (2013.01); *H03F 2200/411* (2013.01); *H03F 2200/447* (2013.01); *H03F 2200/451* (2013.01); *H03F 2203/45292* (2013.01); *H03F 2203/45621* (2013.01)

(58) Field of Classification Search
CPC .......................................................... H03F 3/14
USPC .......................................... 330/307, 302, 66
See application file for complete search history.

(56) References Cited

U.S. PATENT DOCUMENTS

| | | |
|---|---|---|
| 2012/0025269 A1 | 2/2012 | Parkhurst et al. |
| 2012/0025370 A1 | 2/2012 | Wholey et al. |
| 2012/0049345 A1 | 3/2012 | Railkar et al. |

OTHER PUBLICATIONS

Changhyun Yoo, et al. "Ultra-small Form-Factor Helix on Pad-Type Stage-Bypass WCDMA Tx Power Amplifier Using a Chip-Stacking Technique and a Multilayer Substrate", ETRI Journal, vol. 32, No. 2, Apr. 2010.

(Continued)

*Primary Examiner* — Patricia T Nguyen

(57) ABSTRACT

A heterojunction bipolar transistor (HBT) hybrid type RF (radio frequency) power amplifier includes a first device including an input terminal for receiving an RF signal, a pre-driver stage for amplifying the received RF signal, and an output terminal, the input terminal, the pre-driver stage and the output terminal being disposed in or over a first substrate; and a second device having a main stage having an HBT amplifier circuit disposed in or over a second substrate to further amplify the RF signal amplified by the pre-driver stage. The RF signal further amplified by the main stage is output through the output terminal of the first device.

44 Claims, 14 Drawing Sheets

(51) Int. Cl.
 *H03F 3/24* (2006.01)
 *H03F 3/45* (2006.01)
 *H01L 23/48* (2006.01)

(56) References Cited

OTHER PUBLICATIONS

Pete Zampardi, et al. "End-to-End Design and Simulation of Handset Modules", Skyworks Solutions, Inc.
Ashok Bindra, "Silicon-Germanium HBTs Merge With Mainstream CMOS Process", Electronic Design, Jul. 9, 2000.
Muhammad Hassan, "A Wideband CMOS/GaAs HBT Envelope Tracking Power Amplifier for 4G LTE Mobile Terminal Applications", IEEE Transactions on Microwave Theory and Techniques, vol. 60, No. 5, May 2012.
Y. Royter, et al. "Technology for Dense Heterogeneous Integration of InP HBTs and COS", CS MANTECH Conference, May 18-21, 2009, Tampa, Florida.
J.R. Laroche, et al. "Monolithically Integrated III-V and Si CMOS Devices on Silicon on Lattice Engineered Substrates (SOLES)", CS MANTECH Conference, May 18-21, 2009, Tampa, Florida.
Sanjay Raman, et al. "The DARPA Diverse Accessible Heterogeneous Integration (DAHI) Program: Towards a Next-Generation Technology Platform for High-Performance Microsystems", CS MANTECH Conference, Apr. 23-26, 2012, Boston, Massachusetts.
Raytheon Technology, "COSMOS: A Path to Next-Generation High-Performance, Mixed Signal Circuits", Issue 2, 2010.
Jonghun Jung, "A SiGe HBT Power Amplifier with Integrated Mode Control Switches for LTE Applications", Dept. of Nanobio Materials and Electronics, Gwangju Institute of Science and Technology, 1 Oryong-dong, Buk-gu, Gwangju, 500-712, Rep. of Korea.

//HYBRID POWER AMPLIFIER HAVING ELECTRICAL AND THERMAL CONDUCTION PATH

BACKGROUND

A mobile device typically includes an RF power amplifier that amplifies an RF signal during transmission and reception of the RF signal. RF power amplifiers may include a pre-driver stage, a main stage, a bias circuit for driving amplifier circuits of the pre-driver stage and the main stage, an inter-stage impedance matching network between the pre-driver stage and the main stage, an output impedance matching network at an output terminal, and a control circuit for controlling the operation of the RF power amplifier. In particular, the control circuit may control the amplifier circuits of the pre-driver stage and the main stage.

Conventionally, RF power amplifiers may be either complementary metal-oxide semiconductor (CMOS) power amplifiers formed by CMOS integrated circuits (ICs) having CMOS transistors, or HBT power amplifiers formed by ICs having HBTs. HBTs typically operate with good linearity and high efficiency, so that HBT power amplifiers consequently may provide good RF performance with high reliability. HBT power amplifiers therefore have been widely utilized in the mobile power amplifier industry. However, ICs having HBT power amplifiers suffer from a number of drawbacks including high wafer cost and complicated IC manufacturing processes due to the complicated configuration of ICs.

In contrast, CMOS power amplifiers formed by ICs having the CMOS transistors typically have low manufacturing cost, but may however have performance shortcomings due to power loss and/or the non-linear characteristics of CMOS transistors. In addition, when CMOS power amplifiers are used for amplification of an RF signal having a wide frequency band, signal distortions may occur due to the high parasitic input capacitance of CMOS transistors, particularly in the case of P-channel metal oxide semiconductor (PMOS) transistors.

BRIEF DESCRIPTION OF THE DRAWINGS

The example embodiments will become apparent from the following description of embodiments, given in conjunction with the accompanying drawings, in which.

DETAILED DESCRIPTION

Figure 1A:
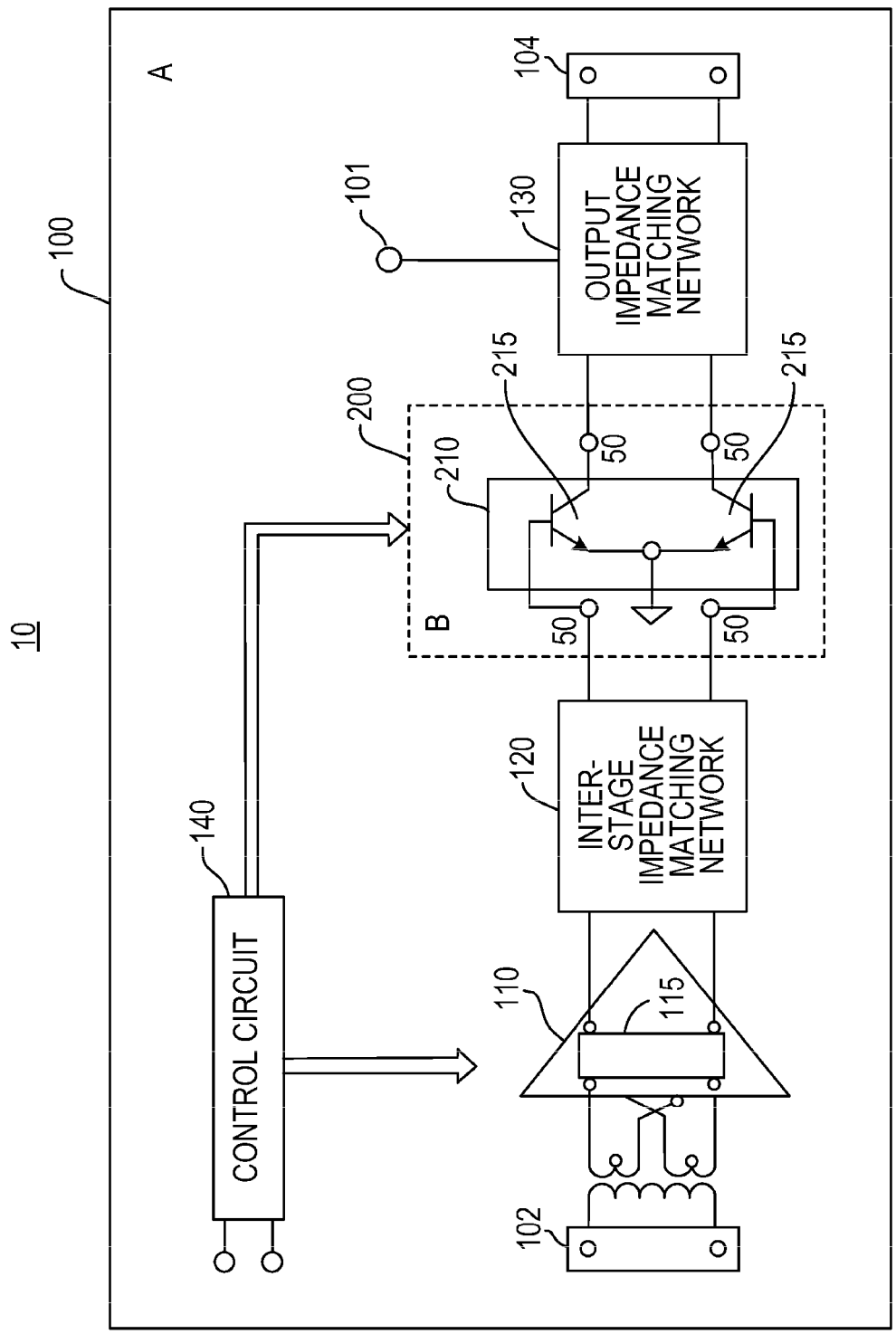
FIG. 1A illustrates a circuit diagram of a hybrid RF power amplifier, according to a representative embodiment.

Hereinafter, representative embodiments will be described in detail with reference to the accompanying drawings. The described embodiments are only exemplary and not to be construed to limit the scope of the invention thereto.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

The terminology used herein is for purposes of describing particular embodiments only, and is not intended to be limiting. The defined terms are in addition to the technical, scientific, or ordinary meanings of the defined terms as commonly understood and accepted in the relevant context.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Other relative terms may also be used to indicate the relative location of certain features along a path such as a signal path. For instance, a second feature may be deemed to "follow" a first feature along a signal path if a signal transmitted along the path reaches the second feature before the second feature.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Generally, the present teachings relate to power amplifier, and more particularly to a hybrid power amplifier comprising a heterojunction bipolar transistor (HBT). In representative embodiments, the hybrid power amplifier is a radio frequency (RF) power amplifier.

FIG. 1A illustrates a circuit diagram of a heterojunction bipolar transistor (HBT) hybrid type radio frequency (RF) power amplifier, according to a representative embodiment.

The hybrid RF power amplifier 10 (which may hereinafter also be referred to as a power amplifier) as shown in FIG. 1A comprises an integrated circuit (IC) A (sometimes referred to below as a first device). The IC A comprises complimentary metal-oxide semiconductor (CMOS) devices. The hybrid RF power amplifier 10 also comprises an IC B (sometime referred to below as a second device) electrically connected to the IC A via a connecting medium 50 such as a copper pillar or wire bond(s). Notably, certain aspects of copper pillars, or more generally, electrically and thermally conductive pillars, of representative embodiments may be found in one of the following commonly owned U.S. Patent Application Publications: 20120025269, 20120025370 and 20120049345. The disclosures of these U.S Patent Application Publications are specifically incorporated herein by reference. Furthermore, and as described more fully below, in addition to providing electrical connections, the pillars of certain representative embodiments usefully provide a thermal connection useful in the dissipation of heat.

As described more fully below, the IC B comprises an HBT and attendant circuitry and components for the operation of the HBT(s) in a desired mode of operation. In a representative embodiment, the IC B may be stacked on or disposed over the IC A and may be electrically connected to the IC A by the connecting medium 50 which may be copper pillars or wire bonds. In a further representative embodiment, the IC B may be disposed adjacent the IC A and may be electrically connected to the IC A via wire bonding. The connecting medium 50 not only provides electrical connection between the IC B and the IC A, but also dissipates heat therethrough. Alternatively, the electrical connection between the IC A and the IC B may be made by printed circuit board (PCB) routing such that junction points of the IC A and the IC B required for electrical connection therebetween are connected to one another.

The IC A may comprise a substrate 100; an input terminal 102 (RF input terminal) formed on the substrate 100, for receiving an RF signal; a pre-driver stage 110 for amplifying the RF signal received by the input terminal 102; an inter-stage impedance matching network 120 (first matching network) connected to an output of the pre-driver stage 110; an output terminal 104 (RF output terminal); an output impedance matching network 130 (second matching network) having one end connected to the output terminal 104; and a control circuit 140 for controlling the entire operation of the hybrid RF power amplifier 10. The control circuit 140 may be a processor or a custom circuit. The control circuit 140 may be responsive to command signals provided from a source (not shown) internal or external of the hybrid RF power amplifier 10. The pre-driver stage 110 may include CMOS transistors 115, and the substrate 100 may be a semiconductor wafer suitable for CMOS processing and having CMOS devices formed thereover. As an alternative, IC A comprises a silicon on insulator (SOI) substrate including pre-driver stage 110 having CMOS transistors 115 may be used.

In a representative embodiment, the substrate 100 comprises silicon or similar semiconductor material (e.g., silicon germanium (Si—Ge). As will be appreciated by one or ordinary skill in the art, the substrate 100 may comprise regions that are doped to form components of various devices. As such, the substrate 100 has a greater degree of electrical conductivity than an undoped semiconductor (e.g., silicon) substrate. Furthermore, silicon provides a comparatively improved degree of thermal conductivity. As such, substrate 100 may comprise a material that usefully provides suitable electrical and thermal conductivity to meet desired results of improved electrical performance and heat dissipation. The IC B may comprise a substrate 200 and a differential HBT amplifier circuit 210 having a pair of HBTs 215 formed over the substrate 200. The substrate 200 may be a semiconductor wafer suitable for processing to form HBTs thereover. In a representative embodiment, substrate 200 may comprise one of a number of Group III-V semiconductor materials, such as, for example of gallium arsenide (GaAs). The differential HBT amplifier circuit 210 may serve as an amplification unit of the main stage of the hybrid RF power amplifier 10, which comprises HBT devices and CMOS devices, and may have a differential amplifier structure.

The inter-stage impedance matching network 120 is provided between the output of the pre-driver stage 110 and the input of the differential HBT amplifier circuit 210, and may perform transmission of the RF signal and impedance matching between pre-driver stage 110 and differential HBT amplifier circuit 210. Respective connecting medium 50 are disposed as connecting inter-stage impedance matching network 120 to the bases of HBTs 215. The output impedance matching network 130 has one end connected to the output terminal 104 and the other end connected to the output of differential HBT amplifier circuit 210, and may perform transmission of the RF signal and impedance matching between the differential HBT amplifier circuit 210 and the output terminal 104. Respective connecting medium 50 are disposed as connecting the collectors of HBTs 215 to output impedance matching network 130. As further shown, the emitters of HBTs 215 are connected to ground by way of connecting medium 50.

In a representative embodiment, the IC B may be a single monolithic microwave integrated circuit (MMIC).

RF signal processing of the hybrid RF power amplifier 10 configured as described above will now be explained. When the RF signal is received through the input terminal 102 of the IC A, the RF signal is amplified by the pre-driver stage 110 including the CMOS transistors 115 responsive to a control signal provided by the control circuit 140, to the extent that the RF signal can be processed by the main stage. The RF signal output from the pre-driver stage 110 is input to the differential HBT amplifier circuit 210 of the IC B, which is the main stage of the hybrid RF power amplifier 10, via the inter-stage impedance matching network 120, and is amplified by the differential HBT amplifier circuit 210 responsive to a control signal provided by the control circuit 140. The RF signal amplified by the differential HBT amplifier circuit 210 is output toward the output terminal 104 via the output impedance matching network 130.

Particularly, the amplification at the main stage of the hybrid RF power amplifier 10 is performed by the differential HBT amplifier circuit 210 having the structure of a differential amplifier which consists of a pair of HBTs 215. Therefore, broad bandwidth can be achieved due to relatively small parasitic capacitance of the HBT device, and high reliability can be ensured due to the high breakdown voltage of the HBT.

Further, since the substrate 100 may be a semiconductor wafer suitable for CMOS processing and the fabrication of CMOS devices thereover, or an SOI substrate similarly suited, a much greater part of the hybrid RF power amplifier 10 may be constructed on IC A rather than on IC B, and consequently the hybrid RF power amplifier 10 may be manufactured with lower cost than known HBT power amplifiers. That is, a large number of components including the pre-driver stage 110, the inter-stage impedance matching network 120, the output impedance matching network 130, the control circuit 140 and the like are formed on the substrate 100, so that the hybrid RF power amplifier 10 may be more simply designed than known differential HBT power amplifier structures.

In certain representative embodiments, the hybrid RF power amplifiers described in connection with representative embodiments comprise differential configurations. It is noted that this is merely illustrative. More generally, the circuit stages of the various representative embodiments could be single-ended or differential, with suitable transformers configured to provide conversion of single-ended signals to differential signals, and vice versa.

Figure 1B:
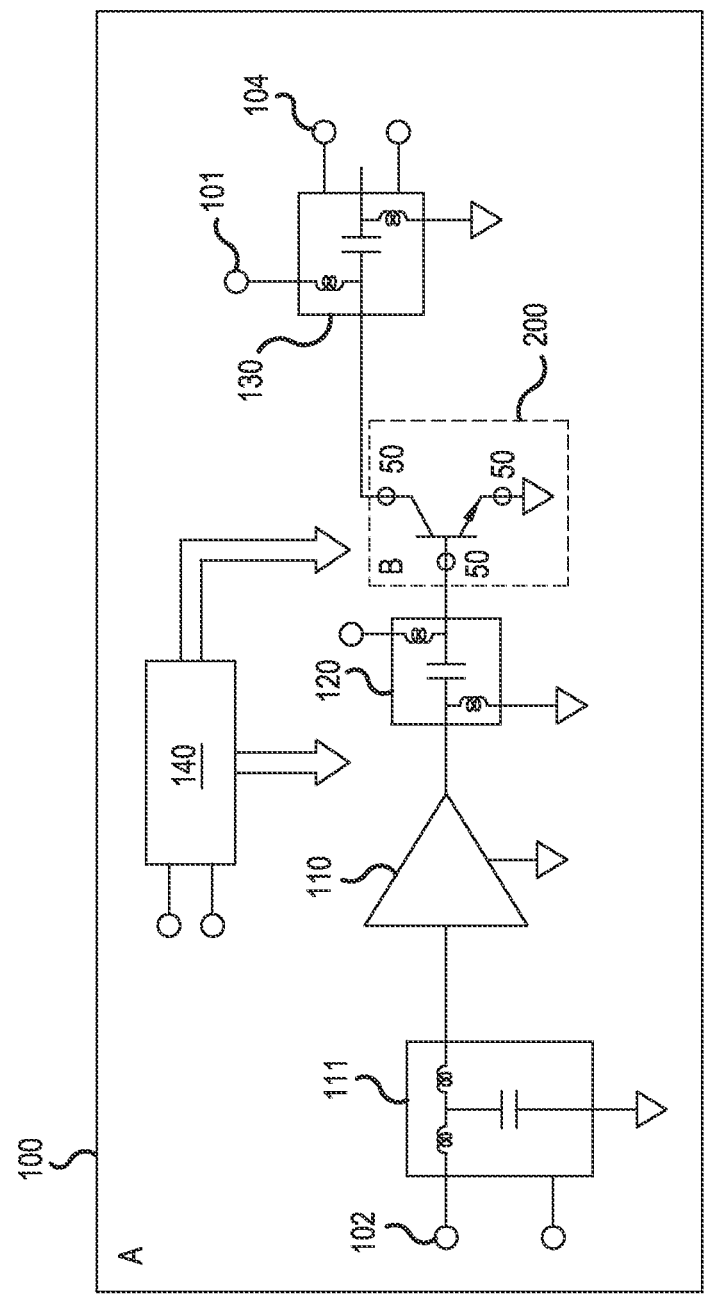
FIG. 1B illustrates a circuit diagram of a hybrid RF power amplifier, according to a representative embodiment.

FIG. 1B illustrates a circuit diagram of a heterojunction bipolar transistor (HBT) hybrid type radio frequency (RF) power amplifier 10, according to a representative embodiment. As can be appreciated, the RF power amplifier is a single-ended configuration. The hybrid RF power amplifier 10 as shown in FIG. 1B comprises an integrated circuit (IC) A (sometimes referred to below as a first device). The IC A comprises complimentary metal-oxide semiconductor (CMOS) devices. The hybrid RF power amplifier 10 also comprises an IC B (sometime referred to below as a second device) electrically connected to the IC A via a connecting medium 50 such as a copper pillar or wire bond(s). As described more fully below, the IC B comprises an HBT and attendant circuitry and components for the operation of the HBT(s) in a desired mode of operation. In a representative embodiment, the IC B may be stacked on or disposed over the IC A and may be electrically connected to the IC A by the connecting medium 50 which may be copper pillars or wire bonds. In a further representative embodiment, the IC B may be disposed adjacent the IC A and may be electrically connected to the IC A via wire bonding. Beneficially, and as alluded to above, the connecting medium 50 not only provides electrical connection between the IC B and the IC A, but also dissipates heat therethrough. Alternatively, the electrical connection between the IC A and the IC B may be made by printed circuit board (PCB) routing such that junction points of the IC A and the IC B required for electrical connection there between are connected to one another.

The IC A may comprise a substrate 100; an input terminal 102 (RF input terminal) formed on the substrate 100, for receiving an RF signal; an impedance matching network 111 (first matching network) connected to a pre-driver stage 110, which amplifies the RF signal received by the input terminal 102; an inter-stage impedance matching network 120 (second matching network) connected to an output of the pre-driver stage 110; an output terminal 104 (RF output terminal); an output impedance matching network 130 (third matching network) having one end connected to the output terminal 104; and a control circuit 140 for controlling the entire operation of the hybrid RF power amplifier 10. Notably, the circuits depicted in the impedance matching network 111, the inter-stage impedance matching network 120 and the output impedance matching network 130 are merely illustrative, and other circuits suitable for use as these matching networks, which are within the purview of one of ordinary skill in the art having the benefit of the present disclosure, are contemplated.

The control circuit 140 may be a processor or a custom circuit. The control circuit 140 may be responsive to command signals provided from a source (not shown) internal or external of the hybrid RF power amplifier 10. The pre-driver stage 110 may include CMOS transistors 115, and the substrate 100 may be a semiconductor wafer suitable for CMOS processing and having CMOS devices formed thereover. As an alternative, IC A comprises a silicon on insulator (SOI) substrate including pre-driver stage 110 having CMOS transistors 115.

Furthermore, the circuit stages of the various representative embodiments could be single-ended or differential, with suitable transformers configured to provide conversion of single-ended signals to differential signals, and vice versa.

Figure 2A:
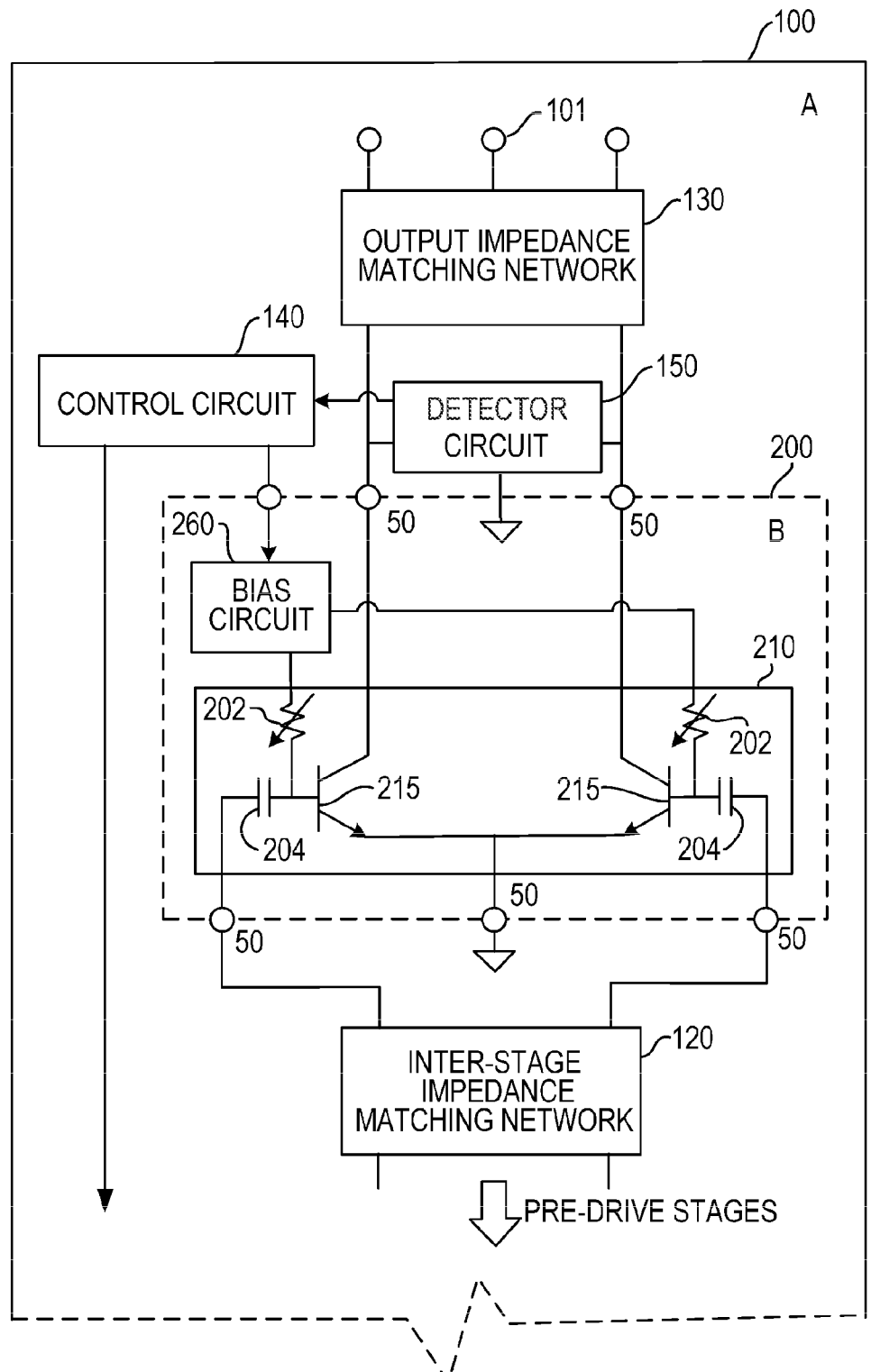
FIG. 2A schematically illustrates a part of a hybrid RF power amplifier, according to a representative embodiment.

FIG. 2A schematically illustrates a part of an HBT hybrid RF power amplifier, according to a representative embodiment. Description of similar aspects and components as that described in connection with the representative embodiments of FIGS. 1A and 1B may be omitted from the description of the representative embodiments described in connection with FIG. 2A.

The IC A of the hybrid RF power amplifier 10 as shown in FIG. 2A further comprises a detector circuit 150 disposed thereover. The detector circuit 150 is configured to protect the differential HBT amplifier circuit 210 from suffering significant damage (e.g., via ESD (electrostatic discharge) or break down) due to operation in extreme situations. The detector circuit 150 detects an output of the differential HBT amplifier circuit 210 and feeds back a current-voltage state of the differential HBT amplifier circuit 210 to the control circuit 140. Then, based on the feedback from the detector circuit 150, the control circuit 140 controls the bias circuit 260 appropriately so that the differential HBT amplifier circuit 210 can be operated in a safe operation area (SOA). The detector circuit 150 may include an ESD protection circuit for protecting the main stage against ESD. The detector circuit 150 may be formed on the substrate 100, and may comprise resistors, diodes, RC filters or other common circuit blocks used for voltage or current detection and signal clipping circuits. Although not illustrated, in other representative embodiments the detector circuit 150 may be formed over the substrate 200 of the IC B, or may be formed over both of the substrates 100 and 200.

The IC B of the hybrid RF power amplifier 10 as shown in FIG. 2A may further comprise a bias circuit 260 configured to bias the differential HBT amplifier circuit 210 of the IC B. The bias circuit 260 may be formed over the substrate 200, and may include a voltage source (not shown) derived from a voltage reference such as a band-gap reference and buffered by an emitter follower circuit, or a current produced with a current mirror from a current reference. The operation of the bias circuit 260 is controlled by the control circuit 140 of the IC A. The emitters of the HBTs 215 of the differential HBT amplifier circuit 210 may be grounded through connecting medium 50, which may comprise wire bonds or copper pillars. Particularly, the emitters of the HBTs 215 may be electrically connected to the ground of the IC A by connecting medium 50. The inter-stage impedance matching network 120 may comprise lump resistors, inductors and capacitors, and is shown as connected to the bases of the HBTs 215 via capacitors 204.

Figure 2B:
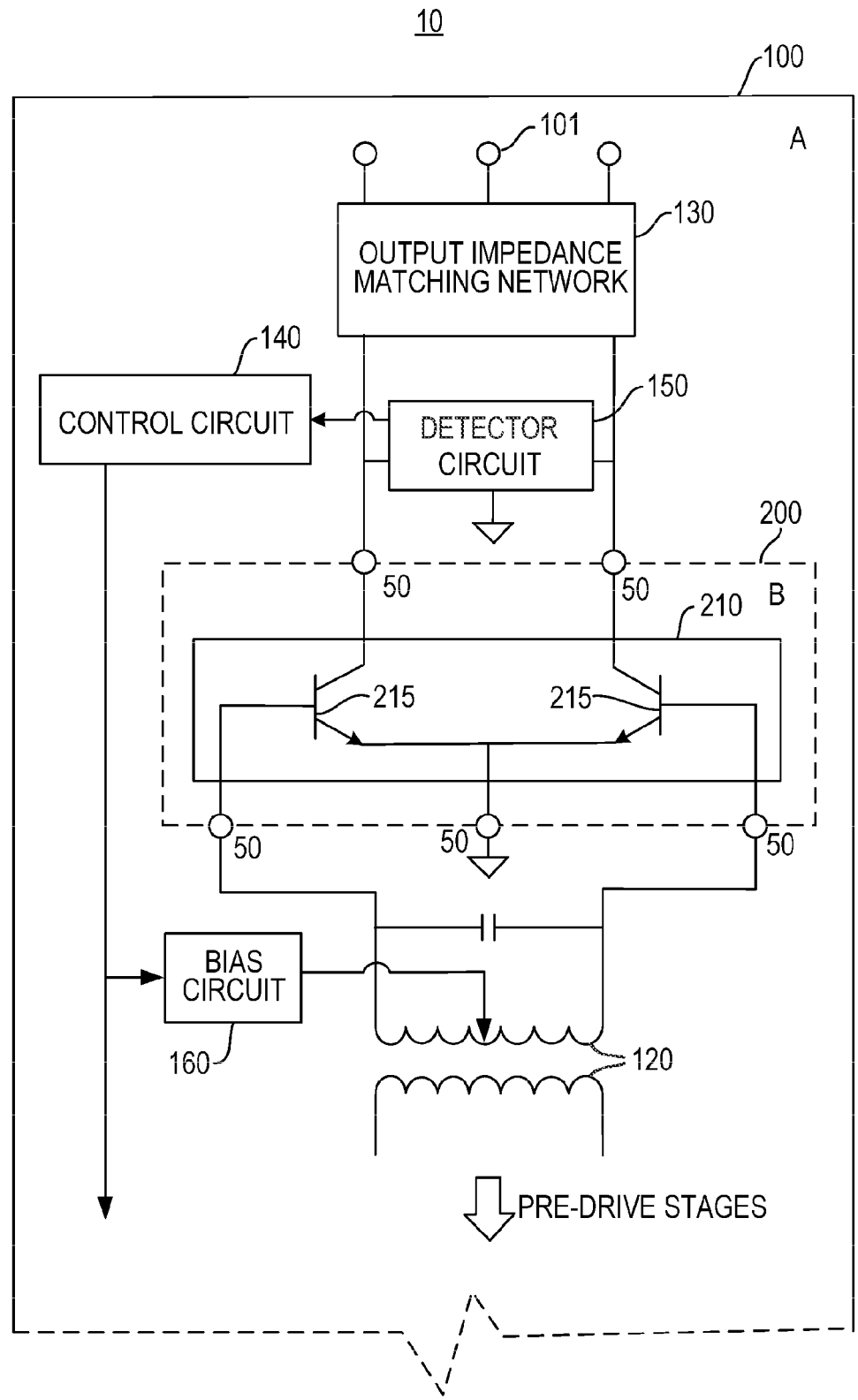
FIG. 2B schematically illustrates a part of a hybrid RF power amplifier, according to another representative embodiment.

FIG. 2B schematically illustrates a part of an HBT type RF power amplifier, according to another representative embodiment. Description of similar parts as that described with respect to FIGS. 1A and 1B may be omitted from the following.

A IC A of the hybrid RF power amplifier 10 shown in FIG. 2B may include a detector circuit 150 for protecting the differential HBT amplifier circuit 210 from suffering significant damage (e.g., via ESD (electrostatic discharge) or break down)) due to operation in extreme situations, by detecting an output voltage of the differential HBT amplifier circuit 210 and feeding back the detected output voltage to the control circuit 140. The detector circuit 150 may be formed on the substrate 100. Although not illustrated, in other representative embodiments the detector circuit 150 may be formed over the substrate 200, or may be formed over both of the substrates 100 and 200.

The inter-stage impedance matching network 120 in this representative embodiment may include a transformer having a primary coil and a secondary coil. Both ends of the primary coil of the transformer may be connected to the output terminals of the pre-driver stage 110, and both ends of the secondary coil may be connected to the bases of the HBTs 215 via the connecting medium 50.

The IC A of the hybrid RF power amplifier 10 as shown in FIG. 2B may further comprise a bias circuit 160 that is formed over the substrate 100 to bias the HBTs 215. The operation of the bias circuit 160 is controlled by the control circuit 140 formed on the substrate 100. The bias circuit 160 may be operable to drive the HBTs 215 by transmitting a bias signal through the inter-stage impedance matching network 120, i.e., the substantial center of the secondary coil of the transformer as shown in FIG. 2B. With such a structure for transmitting the bias signal to the HBTs 215 via the secondary coil of the transformer included as part of inter-stage impedance matching network 120, the HBTs 215 may be driven without the resistors 202 or the capacitors 204 shown in FIG. 2A, which is effective in terms of reducing size and cost. In a representative embodiment that includes ballasting required, resistors 202 can be added in series between the output of the bias circuit 160 and the secondary center tap of transformer in inter-stage impedance matching network 120, or resistors can be placed in series with the HBT 215 bases or emitters. Emitter terminals of the HBTs 215 of the differential HBT amplifier circuit 210 may be grounded through connecting medium 50 which may be wire bonds or copper pillars. Particularly, the emitters may be electrically connected to the ground of the IC A.

Figure 3:
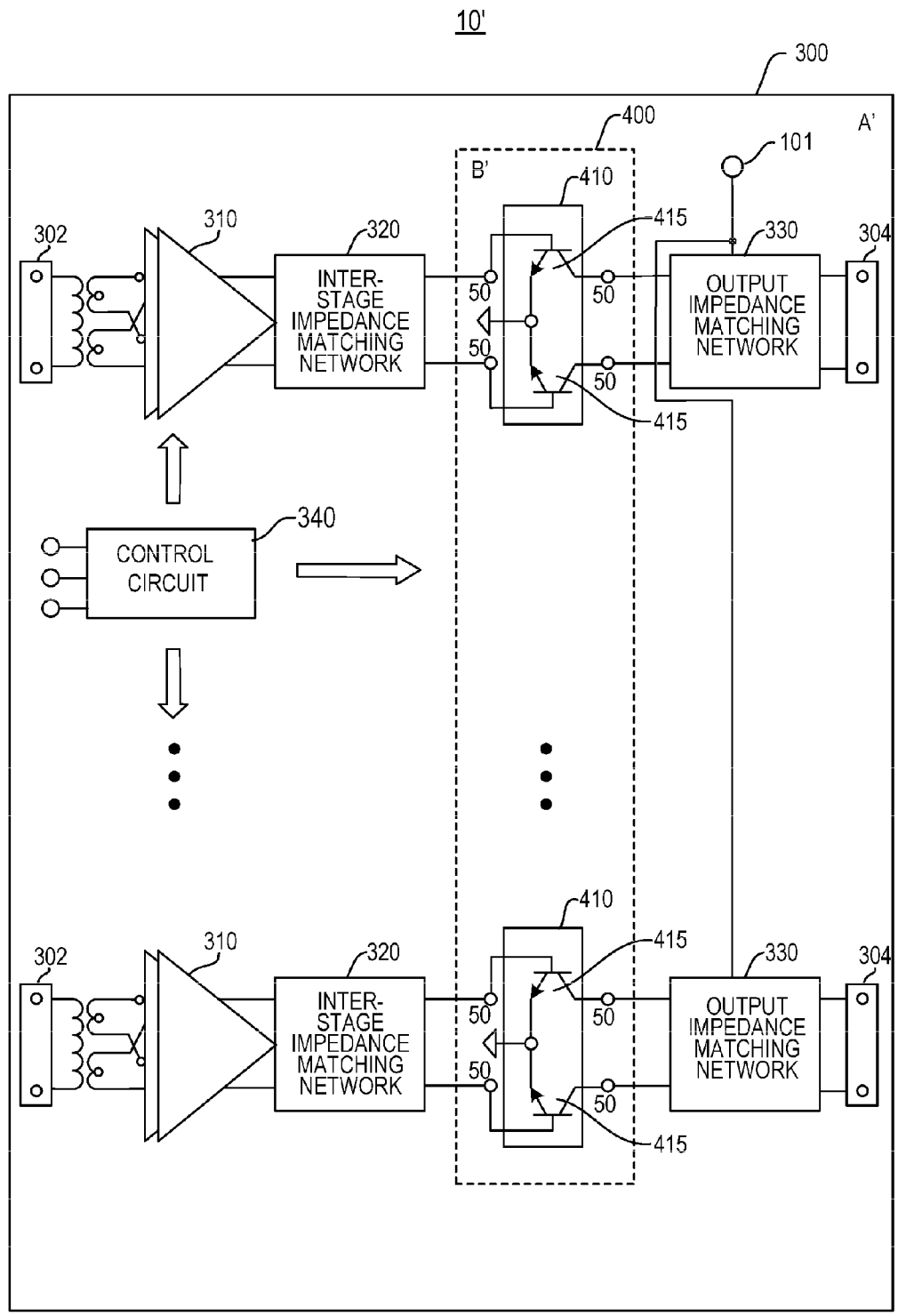
FIG. 3 illustrates a circuit diagram of a hybrid RF power amplifier, operable with various types of RF signals, according to a representative embodiment.

FIG. 3 illustrates a circuit diagram of an HBT type RF power amplifier, operable with various types of RF signals, according to a representative embodiment. Description of similar aspects and components as that described in connection with the representative embodiments of FIGS. 1A-2B may be omitted from the description of the representative embodiments described in connection with FIG. 3.

The hybrid RF power amplifier 10' as shown in FIG. 3 may include a single IC A' and a single IC B'. Similar to the representative embodiments described above, an IC A' comprises CMOS devices, and an IC B' comprises an HBT and attendant circuitry and components for the operation of the HBT(s) in a desired mode of operation.

The IC A' may be electrically connected to the IC B' by connecting medium 50, which may comprise wire bonds or copper pillars. In a representative embodiment, the IC B' may be stacked over or otherwise disposed over the IC A' and may be electrically connected to the IC A' by the connecting medium 50. In a further representative embodiment, the IC B' may be disposed adjacent to the IC A' and may be electrically connected to the IC A' via wire bonding, for example. The connecting medium 50 may be used not only to effect heat dissipation from the substrates 300, 400 (described below), but also to provide electrical connections between the IC B' and the IC A'. Alternatively, the IC A' and the IC B' may be made connected by printed circuit board (PCB) routing such that junction points of the IC A' and the IC B' required for electrical connection therebetween are connected to one another.

The IC A' may comprise a substrate 300, which may be a single wafer; n number of input terminals 302 for receiving respective RF signals; n number of pre-driver stages 310, formed over the substrate 300, for receiving, amplifying and controlling, respectively, the RF signals received through the input terminals; n number of inter-stage impedance matching networks 320 connected to the outputs of the pre-driver stages 310, respectively; n number of output terminals 304; n number of output impedance matching networks 330 connected to the n number of output terminals 304, respectively; and a control circuit 340 for controlling an entire operation of the hybrid RF power amplifier 10'. The control circuit 340 may be a processor or a custom circuit. The control circuit 340 may be responsive to commands provided from a source (not shown) internal or external of hybrid RF power amplifier 10'. Each of the pre-driver stages 310 may include CMOS transistors, and the substrate 300 may be a semiconductor wafer suitable for CMOS processing and having CMOS devices formed thereover. As an alternative, IC A' comprises a silicon on insulator (SOI) substrate, including pre-driver stages 310 having CMOS transistors 115.

The IC B' is disposed in or over a substrate 400. The IC B' also comprises n number of differential HBT amplifier circuits 410 formed over the substrate 400. The substrate 400 may be a semiconductor wafer suitable for processing to form HBTs thereover. In a representative embodiment, substrate 400 may comprise one of a number of Group III-V semiconductor materials, such as, for example, gallium arsenide (GaAs). The differential HBT amplifier circuit 410 may serve as an amplification unit of the main stage of the hybrid RF power amplifier 10', and may have a differential amplifier structure. The input terminals of the n number of differential HBT amplifier circuits 410 may be electrically connected to the n number of inter-stage impedance matching networks 320, respectively, by connecting medium 50, which may be wire bonds or copper pillars. The output terminals of the n number of differential HBT amplifier circuits 410 may be electrically connected to the n number of output impedance matching networks 330, respectively, via connecting medium 50. Alternatively, the hybrid RF power amplifier 10' comprises n number of CMOS transistors and n number of HBTs on a printed circuit board (PCB) (not shown) that provides electrical interconnections between the various components. As such, through the PCB, the input terminals of the n number of differential HBT amplifier circuits 410 are electrically connected to the n number of inter-stage impedance matching networks 320, and the output terminals of the n number of differential HBT amplifier circuits 410 are connected to the n number of output impedance matching networks 330. As a consequence, the hybrid RF power amplifier 10' may include n number of electrically connected RF signal paths, each having a single pre-driver stage 310, an inter-stage impedance matching network 320, an differential HBT amplifier circuit 410, and an output impedance matching network 330. Each of the differential HBT amplifier circuits 410 may include a pair of HBTs 415 and may serve as an amplification unit of the main stage of the hybrid RF power amplifier 10'. In a representative embodiment, the IC B' may be a monolithic microwave integrated circuit (MMIC).

In the hybrid RF power amplifier 10' configured as described above with respect to FIG. 3, when an RF signal is input to the IC A', a single RF signal path may be selected in accordance with a type of the input RF signal, and only the pre-driver stage 310 and the differential HBT amplifier circuit 410 in the selected path are driven responsive to the control circuit 340. With the above configuration, various RF signals having different frequency bandwidths such as UMTS band 1 (universal mobile telecommunications system band 1), UMTS band 5 (universal mobile telecommunications system band 5), GSM HB (global system for mobile communications high band) and GSM LB (global system for mobile communications low band) can be processed by the single hybrid RF power amplifier 10'.

In a representative embodiment, the input terminals 302 or the output terminals 304 as shown in FIG. 3 may be implemented as a single common terminal or multiple terminals by providing an RF switch (not shown) at the input side of the pre-driver stage 310 or the output side of the output impedance matching network 330 of the hybrid RF power amplifier 10'. Further, the n number of output impedance matching networks 330 of the hybrid RF power amplifier 10' may be used while being connected to an antenna or an antenna switch module via n-number of duplexers or filters provided at the output sides of the n number of output impedance matching networks 330.

Figure 4:
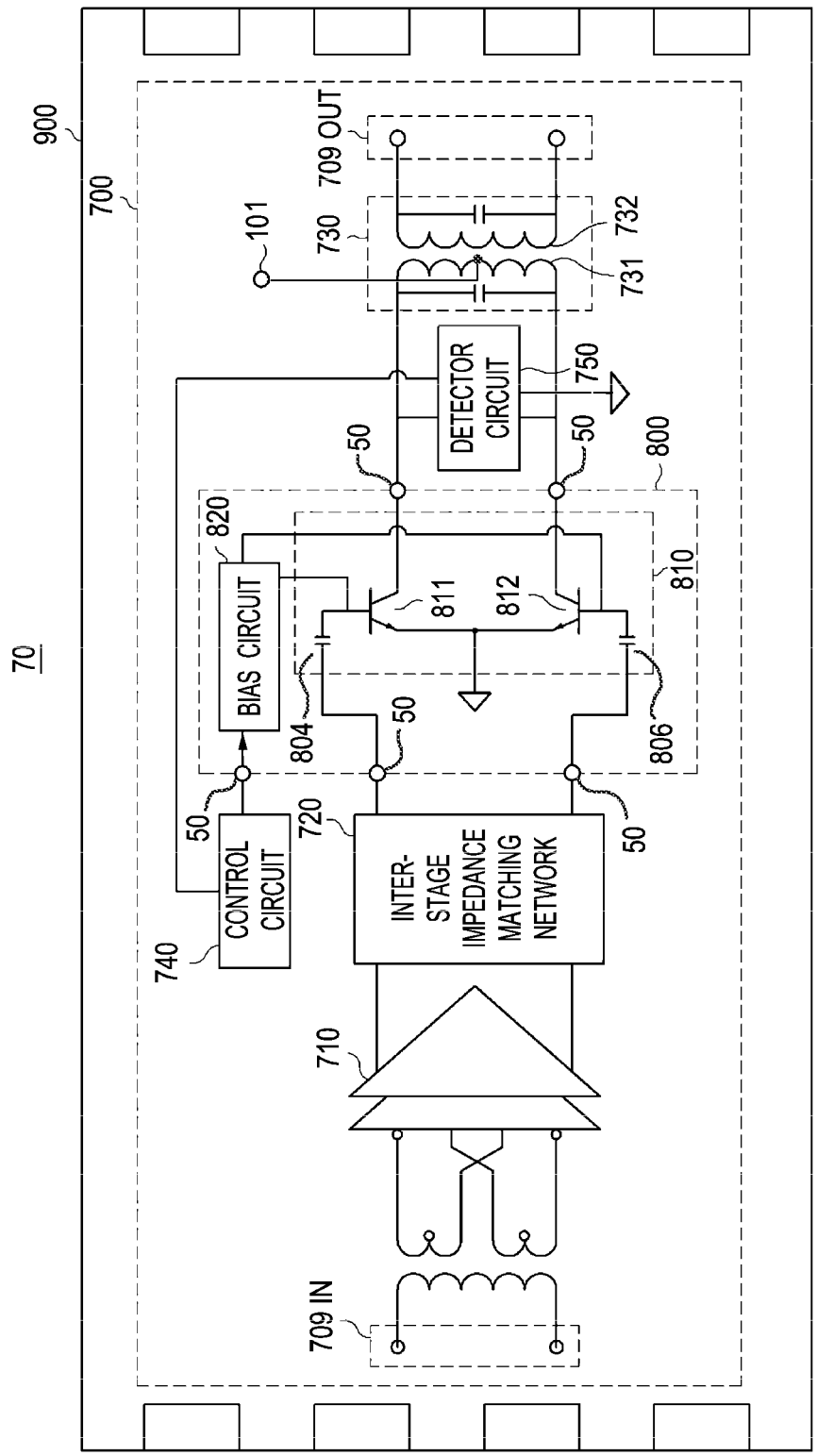
FIG. 4 illustrates a circuit diagram of a hybrid RF power amplifier, according to a representative embodiment.

FIG. 4 illustrates a circuit diagram of a hybrid RF power amplifier 70, according to a representative embodiment. Description of similar aspects and components as that described in connection with the representative embodiments of FIGS. 1A-3 may be omitted from the description of the representative embodiments described in connection with FIG. 4.

The hybrid RF power amplifier 70 shown in FIG. 4 comprises an IC 700 (sometimes referred to below as a first device). The IC 700 may be fabricated from a semiconductor wafer (not shown in FIG. 4) suitable for CMOS processing and having CMOS devices formed thereover. As such, the IC 700 comprises complimentary metal-oxide semiconductor (CMOS) devices. As an alternative, IC 700 may be fabricated over a silicon on insulator (SOI) substrate (not shown in FIG. 4). The use of an SOI substrate may result in further improvement of performance of the RF power amplifier over the use of another substrate (e.g., a silicon substrate typically used in the CMOS applications).

The hybrid RF power amplifier 70 also comprises an IC 800 (sometimes referred to below as a second device) electrically connected to the IC 700 via a connecting medium 50 such as a copper pillar or wire bond(s). As described more fully below, the IC 800 comprises an HBT and attendant circuitry for the operation of the HBT(s) in a desired mode of operation. The IC 800 may be formed from or over a semiconductor wafer (not shown in FIG. 4) suitable for processing to form HBTs thereover. In a representative embodiment, the semiconductor wafer may comprise one of a number of Group III-V semiconductor materials, such as, for example, gallium arsenide (GaAs). The differential HBT amplifier circuit 410 may serve as an amplification unit of the main stage of the hybrid RF power amplifier 10', and may have a differential amplifier structure.

In a representative embodiment, the IC 800 may be stacked on or disposed over the IC 700, which is disposed over a substrate 900. The IC 800 may be electrically connected to the IC 700 by the connecting medium 50 which may be copper pillars or wire bonds. In a further representative embodiment, the IC 800 may be disposed adjacent the IC 700 and over the substrate 900. In such a configuration, the IC 800 may be electrically connected to the IC 700 via wire bonding. In a representative embodiment, the substrate 900 may be one of a number of printed circuit boards, including various types of multi-layer circuit boards, or a lead frame.

As noted above, the connecting medium 50 not only provides electrical connection between the IC 700 and the IC 800, but also may dissipate heat therethrough. Alternatively, the IC 700 and the IC 800 may be additionally connected by printed circuit board (PCB) routing such that junction points of the IC 700 and the IC 800 required for electrical connection therebetween are connected to one another.

The IC 800 may comprise an HBT amplifier circuit 810 and a bias circuit 820, both of which may be formed on semiconductor wafer suitable for processing to form HBTs thereover. In other representative embodiments, the IC 800 may be a MMIC.

The IC 700 and the IC 800 may be electrically connected via one or more connecting medium 50 such as copper pillars and/or bonding wires. The IC 700 and the substrate 900 may also be electrically connected to one another via one or more connecting medium 50 such as copper pillars and/or bonding wires. In addition to providing electrical connection, the connecting medium 50 may also dissipate heat. A detailed structure of these connections will be subsequently described.

The CMOS amplifier circuit 710 may include a CMOS transistor and may be operated as a pre-driver stage for amplifying an RF input signal received through the RF input terminal 709 IN. An output of the CMOS amplifier circuit 710 is transferred to the inter-stage impedance matching network 720. The inter-stage impedance matching network 720 is interposed between the CMOS amplifier circuit 710 and the HBT amplifier circuit 810, and performs impedance matching therebetween.

The HBT amplifier circuit 810 comprises an HBT transistor and can be operated as a main stage for amplifying a signal received from the inter-stage impedance matching network 720. In a representative embodiment, the HBT amplifier circuit 810 may be a common-emitter differential amplifier circuit including a pair of HBTs 811 and 812. Capacitors 804 and 806 may be electrically connected to respective bases of the pair of HBTs 811 and 812. In other representative embodiments, the HBT amplifier circuit 810 may be a differential amplifier circuit including a plurality of pairs of HBTs. An output stage of the HBT amplifier circuit 810 (i.e., the collectors of the HBTs) is electrically connected to the output impedance matching network 730.

The output impedance matching network 730 performs impedance matching between the HBT amplifier circuit 810 and the RF output terminal 712 OUT. The output impedance matching network 730 may include a transformer having a primary coil or winding 731 connected to the collectors of HBTs 811 and 812 of the HBT amplifier circuit 810, and a secondary winding or coil 732 connected to the RF output terminal 712 OUT, that performs the impedance matching. The DC power supply to the HBT amplifier circuit 810 is supplied through a center tap in the primary winding 713. The inter-stage impedance matching network 720 may be configured in a similar manner. In representative embodiments, the RF output terminal 712 OUT may be electrically connected to an SOI IC, an integrated passive device (IPD) or the substrate 900.

The bias circuit 820 may be connected to bases of the HBTs 811 and 812 of the HBT amplifier circuit 810. Bias circuit 820 biases the HBT amplifier circuit 810 responsive to a control signal from control circuit 740. In representative embodiments, the bias circuit 820 may be formed on the IC 700 rather than on the IC 800. The control circuit 740 is electrically connected to the bias circuit 820 and controls the HBT amplifier circuit 810 by controlling the bias circuit 820.

In order to prevent the HBT amplifier circuit 810 from suffering significant damage (e.g., via ESD (electrostatic discharge) or break down) due to operation in extreme situations, the detector circuit 750 detects an output of the HBT amplifier circuit 810 and feeds back a current-voltage state of the HBT amplifier circuit 810 to the control circuit 740. Then, based on the feedback from the detector circuit 750, the control circuit 740 controls the bias circuit 820 appropriately so that the HBT amplifier circuit 810 can be operated in a safe operation area (SOA). The detector circuit 750 may include an ESD protection circuit, such as ESD diode strings, for protecting the main stage against ESD as well as protection from breakdown. Although the detector circuit 750 is shown in FIG. 4 as formed on the IC 700, in other representative embodiments, detector circuit 750 may be formed on the IC 800 or on both of the IC 700 and the IC 800.

The substrate 900 in this representative embodiment may be a laminate substrate. In other representative embodiments, the IC 700 may be directly connected to a board rather than the substrate 900.

As described above, according to a representative embodiment, the operation of the main stage (i.e., the HBT amplifier circuit 810) of the hybrid RF power amplifier 70 shown in FIG. 4 is performed in the IC 800, and operations of most of the other components except for the main stage are performed in the IC 700. Since the RF performance of an amplifier depends mainly on the main stage, the hybrid RF power amplifier 70 using the HBT amplifier circuit 810 included in the IC 800 as the main stage may have RF performance comparable to that of an HBT power amplifier. In addition, the hybrid RF power amplifier 70 may also secure high linearity, low input parasitic capacitance, wide bandwidth and high reliability. On the other hand, since the control circuit 740 of the hybrid RF power amplifier 70 is included in the IC 700, the control circuit 740 can control the hybrid RF power amplifier 70 simply, as if it were a CMOS power amplifier. In addition, since most of the components constituting the hybrid RF power amplifier 70 are included in the IC 700, production costs can be further reduced as compared to the costs associated with an HBT power amplifier.

Hereinafter, a detailed structure of the hybrid RF power amplifier 70 will be described.

Figure 5:
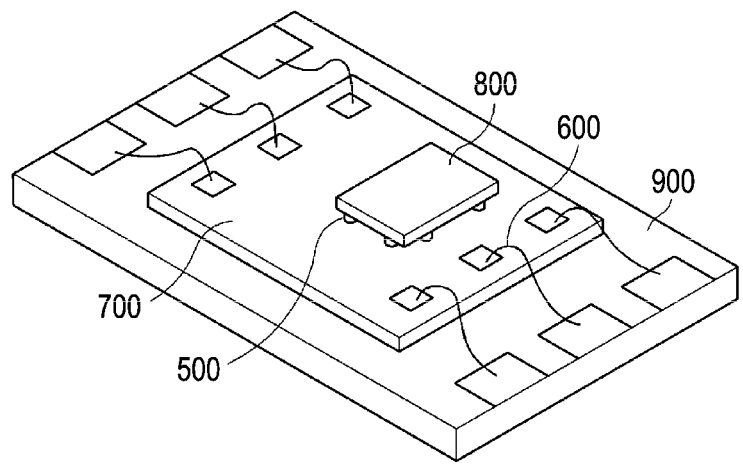
FIG. 5 illustrates a perspective view showing a structure of a hybrid RF power amplifier, according to a representative embodiment.
Figure 6:
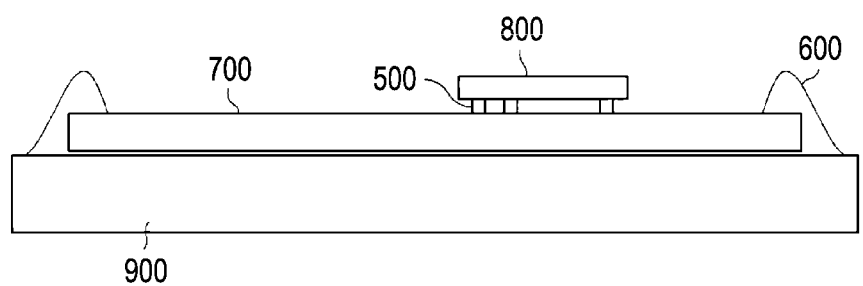
FIG. 6 illustrates a longitudinal sectional view showing a structure of the hybrid RF power amplifier shown in FIG. 5, according to representative embodiment.

FIG. 5 illustrates a perspective view showing a structure of a hybrid RF power amplifier, according to a representative embodiment. FIG. 6 illustrates a longitudinal sectional view showing a structure of the hybrid RF power amplifier shown in FIG. 5, according to representative embodiment. Description of similar aspects and components as that described in connection with the representative embodiments of FIGS. 1A-4 may be omitted from the description of the representative embodiments described in connection with FIGS. 5 and 6.

Referring to FIGS. 5 and 6, the hybrid RF power amplifier has a structure in which the IC 700 (which may be characterized as a first device) is mounted over the substrate 900 and the IC 800 (which may be characterized as a second device) is stacked on or disposed over the IC 700. The IC 700 and the IC 800 may be electrically connected to each other via conductive pillars 500 interposed between the lower surface of the IC 800 and the upper surface of the IC 700. In addition, the IC 700 and the substrate 900 may be electrically connected to each other via bonding wires 600. The engagement of the IC 700 and the IC 800 will be described in more detail below with reference to FIGS. 7A and 7B.

In accordance with a representative embodiment, the conductive pillars 500 comprise a material that is not only electrically conductive, but also is thermally conductive. While many metals and alloys suffice for these desired traits, other materials are contemplated. As such, the conductive pillars 500 also provide a path to dissipate heat generated by the IC 800 to a thermal sink (not shown). In such embodiments, the substrate 900 may comprise a material or components that are thermally and electrically conductive to foster this heat dissipation. In certain embodiments, the conductive pillar comprises a metal, such as copper, or a metal alloy. Moreover, as noted above, while conductive pillars 500 are useful in providing the desired electrical and thermal conduction, other configurations are contemplated. For example, a thermally and electrically conductive material such as certain epoxy resins could be used instead of the conductive pillars 500. Finally, and again as noted above, the substrate from which the IC 700 is fabricated may comprise doped silicon, which provides comparatively increased thermal and electrical conductivity.

Figure 7A:
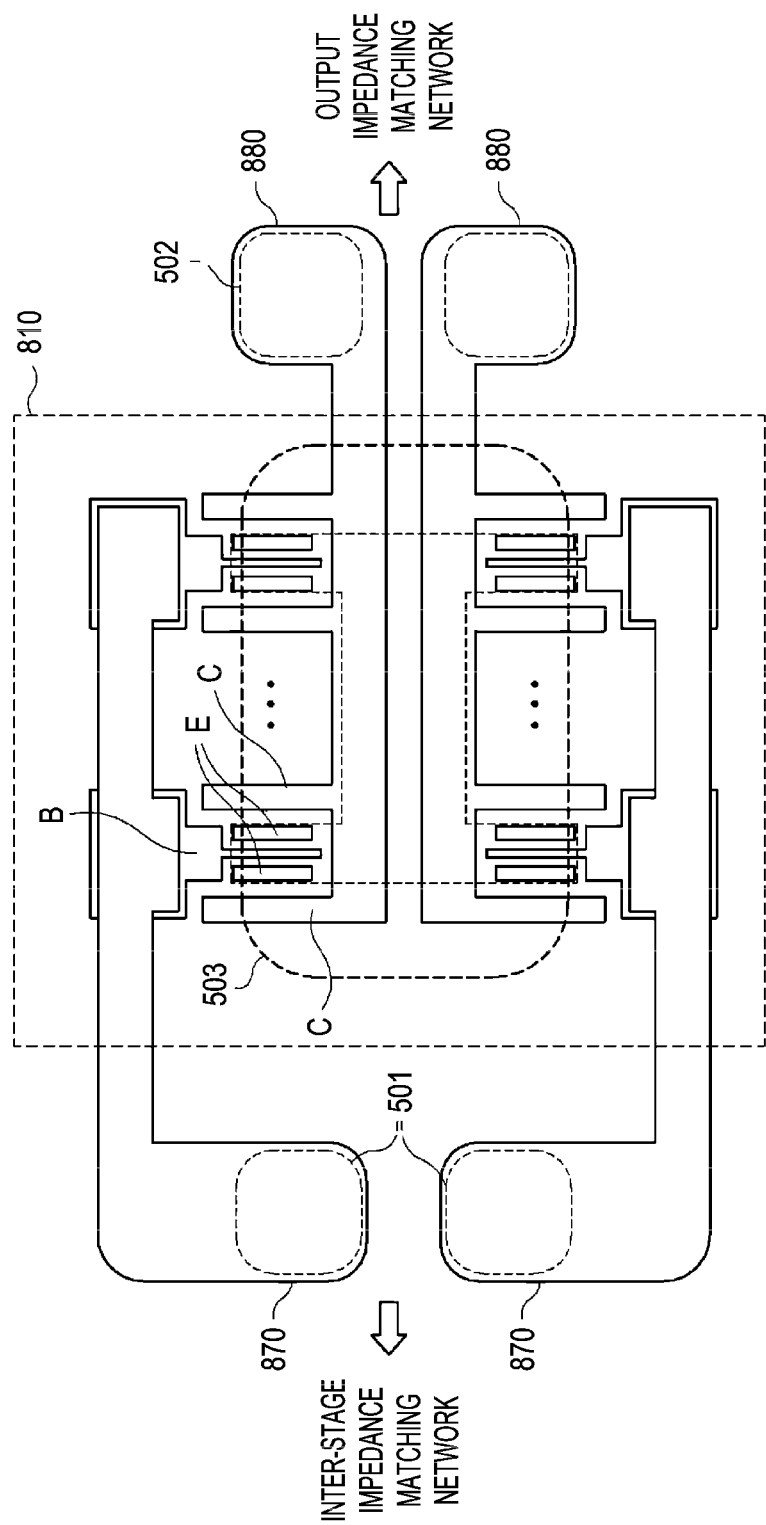
FIGS. 7A and 7B illustrate diagrams showing engagement between an IC and a IC of the hybrid RF power amplifier such as shown in FIG. 6, according to a representative embodiment.
Figure 7B:
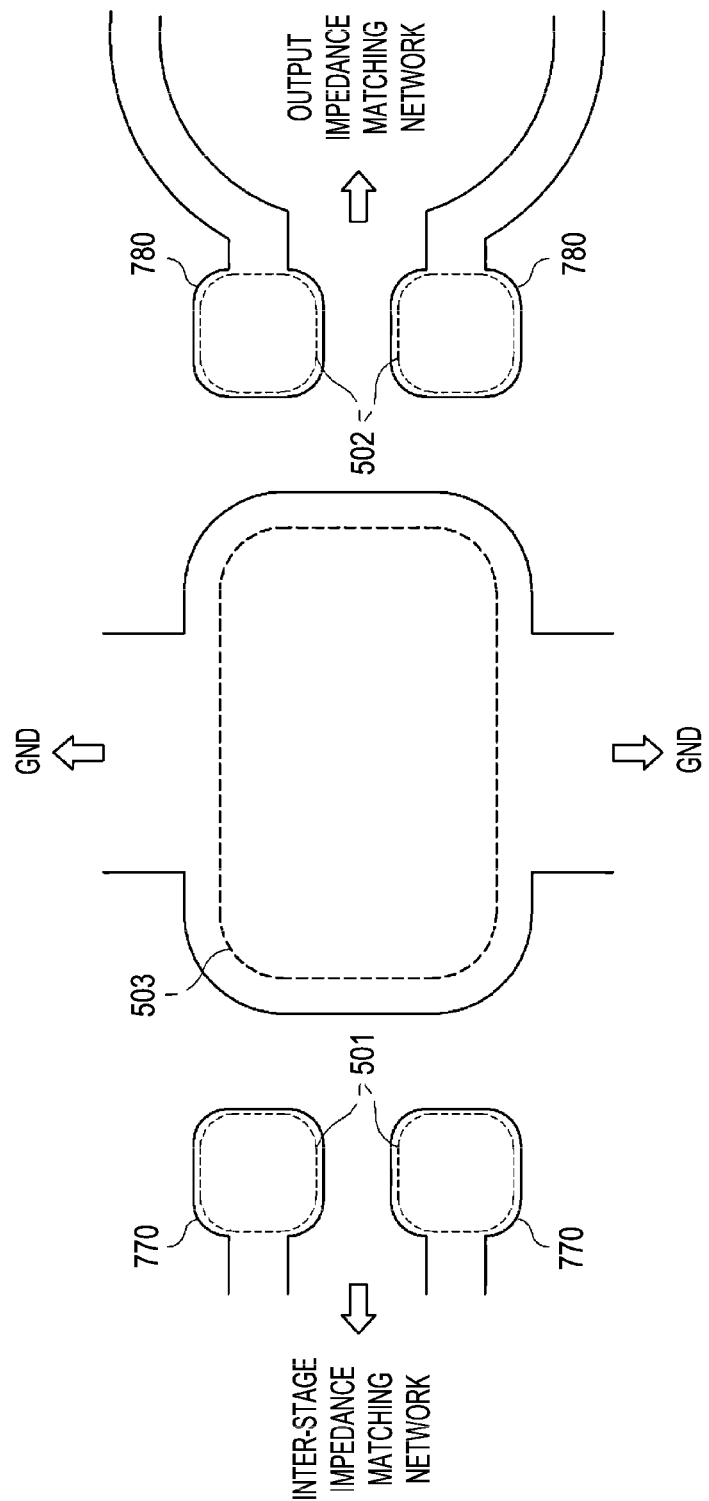

FIGS. 7A and 7B illustrate diagrams showing engagement between IC 700 and IC 800 of the hybrid RF power amplifier such as shown in FIG. 6, according to a representative embodiment. Description of similar aspects and components as that described in connection with the representative embodiments of FIGS. 1A-6 may be omitted from the description of the representative embodiments described in connection with FIGS. 7A and 7B.

FIG. 7A shows the lower surface of the IC 800 and FIG. 7B shows the upper surface of the IC 700. That is, elements of the IC 800 can be formed on the lower surface of the IC 800, and elements of the IC 700 can be formed on the upper surface of the IC 700.

Referring to FIGS. 7A and 7B, first HBT bonding pads 870 electrically connected to an input stage of the HBT amplifier circuit 810 (i.e., a bases B of HBTs 811 and 812) are formed on the lower surface of the IC 800. First CMOS bonding pads 770 electrically connected to the inter-stage impedance matching network 720 are formed on the upper surface of the IC 700 corresponding to the positions of the first HBT bonding pads 870. The first HBT bonding pads 870 and the first CMOS bonding pads 770 are electrically connected to each other via conductive (e.g., copper or other suitable electrically conductive material) pillars 501. Accordingly, the inter-stage impedance matching network 720 of the IC 700 and the HBT amplifier circuit 810 of the IC 800 can be electrically connected to each other. In accordance with a representative embodiment, the pillar 501 comprises a material that is not only electrically conductive, but also is thermally conductive. While many metals and alloys suffice for these desired traits, other materials are contemplated.

Similarly, second HBT bonding pads 880 electrically connected to an output stage of the HBT amplifier circuit 810 (i.e., collectors C of the HBTs 811 and 812) are formed on the lower surface of the IC 800. Second CMOS bonding pads 780 electrically connected to the output impedance matching network 730 are formed on the upper surface of the IC 700 corresponding to the positions of the second HBT bonding pads 880. The second HBT bonding pads 880 and the second CMOS bonding pads 780 are connected to each other via conductive (e.g., copper or other suitable electrically conductive material) pillars 502. Accordingly, the output impedance matching network 730 of the IC 700 and the HBT amplifier circuit 810 of the IC 800 can be electrically connected to each other. Although bonding pads 770, 780, 870 and 880 in FIGS. 7A and 7B are generally shown as substantially square-shaped, this is merely illustrative. In other representative embodiments bonding pads 770, 780, 870 and 880 may have different shapes, such as circular or elliptical in cross-section. Moreover, in accordance with a representative embodiment, the pillars 502 comprise a material that is not only electrically conductive, but also is thermally conductive. While many metals and alloys suffice for these desired traits, other materials are contemplated.

Emitters E of the HBTs 811 and 812 of the HBT amplifier circuit 810 of the IC 800 as shown in FIG. 7A are electrically connected to a ground node formed on the upper surface of the IC 700 via a conductive (e.g., copper or other suitable electrically conductive material) pillar 503. Moreover, in accordance with a representative embodiment, the pillar 503 comprises a material that is not only electrically conductive, but also is thermally conductive. While many metals and alloys suffice for these desired traits, other materials are contemplated.

In other representative embodiments, a plurality of copper pillars may be used instead of the single pillar 503. In other representative embodiments, the positions of the bonding pads 770, 780, 870 and 880 may be appropriately altered.

Figure 8:
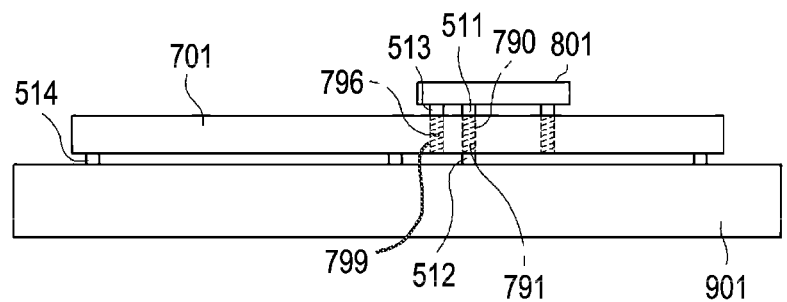
FIG. 8 illustrates a longitudinal sectional view showing a first modification of the hybrid RF power amplifier shown in FIGS. 5 and 6, according to a representative embodiment.

FIG. 8 illustrates a longitudinal sectional view showing a first modification of the hybrid RF power amplifier shown in FIGS. 5 and 6, according to a representative embodiment. Description of similar aspects and components as that described in connection with the representative embodiments of FIGS. 1A-7B may be omitted from the description of the representative embodiments described in connection with FIG. 8. In this representative embodiment, the elements of an IC 701 are formed on the lower surface of the IC 701 and elements of an IC 801 are formed on the lower surface of the IC 801.

The IC 701 may be fabricated from a semiconductor wafer (not shown in FIG. 8) suitable for CMOS processing and having CMOS devices formed thereover. As such, the IC 701 comprises complimentary metal-oxide semiconductor (CMOS) devices. As an alternative, IC 701 may be fabricated over a silicon on insulator (SOI) substrate (not shown in FIG. 8). The use of an SOI substrate may result in further improvement of performance of the RF power amplifier or other circuit blocks (such as RF switches) over the use of another substrate (e.g., a silicon substrate typically used in the CMOS applications).

The IC 801 may be formed from or over a semiconductor wafer (not shown in FIG. 8) suitable for processing to form HBTs thereover. In a representative embodiment, semiconductor wafer may comprise one of a number of Group III-V semiconductor materials, such as, for example, gallium arsenide (GaAs).

Referring to FIG. 8, at least one through-hole 790 penetrating through the IC 701 in a thickness direction is formed in the IC 701 and a through-silicone-via (TSV) 791 (which may be characterized as a conductive via) electrically connecting the upper surface and the lower surface of the IC 701 is formed inside the at least one through-hole 790. A conductive (e.g., copper or other suitable electrically conductive material) pillar 511 is formed between the upper surface of the TSV 791 and the lower surface of the IC 801, and a conductive (e.g., copper or other suitable electrically conductive material) pillar 512 is formed between the lower surface of the TSV 791 and a upper surface of a substrate 901. Accordingly, the elements formed on the lower surface of the IC 801 are electrically connected to the top surface of the substrate 901 via the pillar 511, the TSV (conductive via) 791 and the copper (conductive) pillar 512. In addition to providing electrical connection, the TSV 791 dissipates heat from IC 801, in this case to substrate 901 by way of pillars 511 and 512. As such, in accordance with a representative embodiment, the pillars 511 and 512 each comprise a material that is not only electrically conductive, but also is thermally conductive. While many metals and alloys suffice for these desired traits, other materials are contemplated.

In addition, as further shown in FIG. 8, at least one another through-hole 799 penetrating through the IC 701 in a thickness direction is formed in the IC 701 and a conductive via 796 is formed in through-hole 799 electrically interconnecting the top surface and the lower surface of the IC 701. Notably, the conductive via 796 comprises a material that is not only electrically conductive, but also is thermally conductive. As noted above, while many metals and alloys suffice for these desired traits, other materials are contemplated. Beneficially, therefore, the conductive via 796 provides an electrical connection and a thermal connection. A conductive (e.g., copper or other suitable electrically conductive material) pillar 513 is formed between the top surface of the conductive via 796 and the lower surface of the IC 801. Accordingly, the elements formed on the lower surface of the IC 701 are electrically connected to the elements formed on the lower surface of the IC 801 via the conductive via 796 and the pillar 513. Also, the lower surface of the IC 701 and the top surface of the substrate 901 are electrically connected to each other via a conductive (e.g., copper or other suitable electrically conductive material) pillar 514 formed therebetween. Moreover, in accordance with a representative embodiment, the pillars 513, 514 comprises a material that is not only electrically conductive, but also is thermally conductive. While many metals and alloys suffice for these desired traits, other materials are contemplated.

In other representative embodiments, more than one pillar 514 may be included to electrically connect the lower surface of IC 701 to the top surface of substrate 901.

Figure 9:
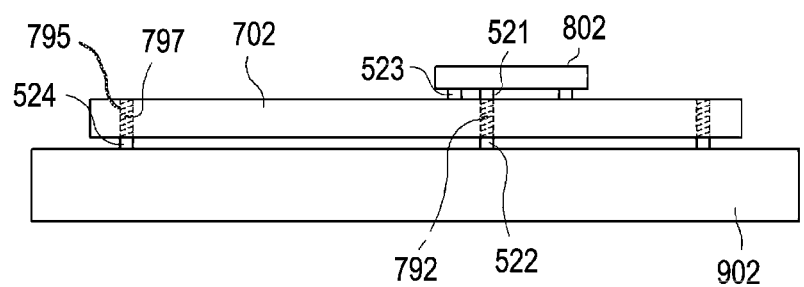
FIG. 9 illustrates a longitudinal sectional view showing a second modification of the hybrid RF power amplifier shown in FIGS. 5 and 6, according to a representative embodiment.

FIG. 9 illustrates a longitudinal sectional view showing a second modification of the hybrid RF power amplifier shown in FIGS. 5 and 6, according to a representative embodiment. Description of similar aspects and components as that described in connection with the representative embodiments of FIGS. 1A-8 may be omitted from the description of the representative embodiments described in connection with FIG. 9.

In this representative embodiment, the elements of the IC 702 are formed on the top surface of the IC 702 and the elements of the IC 802 are formed on the lower surface of the IC 802.

The IC 702 may be fabricated from a semiconductor wafer (not shown in FIG. 9) suitable for CMOS processing and having CMOS devices formed thereover. As such, the IC 702 comprises complimentary metal-oxide semiconductor (CMOS) devices. As an alternative, IC 702 may be fabricated over a silicon on insulator (SOI) substrate (not shown in FIG. 9). The use of an SOI substrate may result in further improvement of performance of the RF power amplifier or other circuit blocks (such as RF switches) over the use of another substrate (e.g., a silicon substrate typically used in the CMOS applications).

The IC 802 may be formed from or over a semiconductor wafer (not shown in FIG. 8) suitable for processing to form HBTs thereover. In a representative embodiment, semiconductor wafer may comprise one of a number of Group III-V semiconductor materials, such as, for example, gallium arsenide (GaAs).

Referring to FIG. 9, in the manner similar to that described and shown with respect to FIG. 8, the elements formed on a lower surface of an IC 802 are electrically connected to a top surface of a substrate 902 by at least one set of a conductive (e.g., copper pillar) 521, a TSV 792 and a conductive (e.g., copper or other suitable electrically conductive material) pillar 522. As further shown in FIG. 9, the elements formed on the lower surface of the IC 802 and the elements formed on the top surface of the IC 702 are electrically connected to each other via at least one conductive (e.g., copper or other suitable electrically conductive material) pillar 523 formed therebetween. Moreover, in accordance with a representative embodiment, the pillar 521 comprises a material that is not only electrically conductive, but also is thermally conductive. While many metals and alloys suffice for these desired traits, other materials are contemplated.

In addition, as also shown in FIG. 9, at least one through-hole 795 penetrating through the IC 702 in a thickness direction is formed in the IC 702 and a conductive via 797 electrically interconnecting the top surface and lower surface of the IC 702 is formed inside the at least one through-hole 795. Notably, the conductive via 797 comprises a material that is not only electrically conductive, but also is thermally conductive. While many metals and alloys suffice for these desired traits, other materials are contemplated. Beneficially, therefore, the conductive via 797 provides an electrical connection and a thermal connection.

At least one conductive (e.g., copper or other suitable electrically conductive material) pillar 524 is formed between the lower surface of the internal electrode 797 and the top surface of the substrate 902. Accordingly, the elements formed on the top surface of the IC 702 are electrically connected to the top surface of the substrate 902 via the conductive via 797 and the pillar 524. Moreover, in accordance with a representative embodiment, the pillar 524 comprises a material that is not only electrically conductive, but also is thermally conductive. While many metals and alloys suffice for these desired traits, other materials are contemplated.

Figure 10:
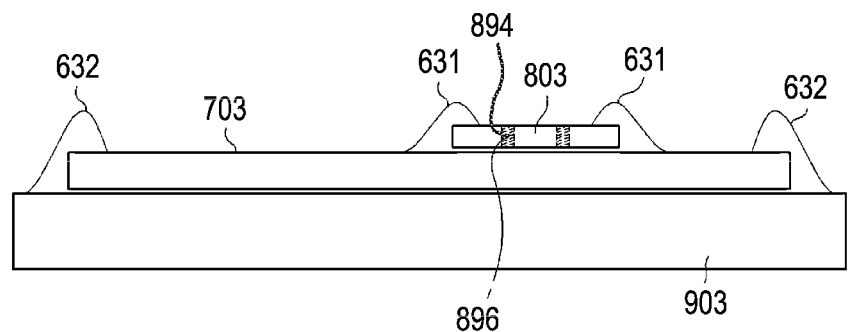
FIG. 10 illustrates a longitudinal sectional view showing a third modification of the hybrid RF power amplifier shown in FIG. 6, according to a representative embodiment.

FIG. 10 illustrates a longitudinal sectional view showing a third modification of the hybrid RF power amplifier shown in FIGS. 5 and 6, according to a representative embodiment. Description of similar aspects and components as that described in connection with the representative embodiments of FIGS. 1A-9 may be omitted from the description of the representative embodiments described in connection with FIG. 10.

In this representative embodiment, elements of IC 703 are formed on the top surface of the IC 703 and elements of IC 803 are formed on the top surface of the IC 803.

The IC 703 may be fabricated from a semiconductor wafer (not shown in FIG. 10) suitable for CMOS processing and having CMOS devices formed thereover. As such, the IC 703 comprises complimentary metal-oxide semiconductor (CMOS) devices. As an alternative, IC 703 may be fabricated over a silicon on insulator (SOI) substrate (not shown in FIG. 10). The use of an SOI substrate may result in further improvement of performance of the RF power amplifier or other circuit blocks (such as RF switches) over the use of another substrate (e.g., a silicon substrate typically used in the CMOS applications).

The IC 803 may be formed from or over a semiconductor wafer (not shown in FIG. 10) suitable for processing to form HBTs thereover. In a representative embodiment, the semiconductor wafer may comprise one of a number of Group III-V semiconductor materials, such as, for example of gallium arsenide (GaAs).

Referring to FIG. 10, at least one through-hole 894 penetrating through the IC 803 in a thickness direction is formed in the IC 803 and a conductive via 896 electrically interconnecting the top surface and the lower surface of the IC 803 is formed inside the at least one through-hole 894. Notably, the conductive via 896 comprise a material that is not only electrically conductive, but also is thermally conductive. While many metals and alloys suffice for these desired traits, other materials are contemplated. Beneficially, therefore, the conductive via 896 provides an electrical connection and a thermal connection.

Elements formed on the top surface of the IC 803 are electrically connected to the elements formed on the top surface of the IC 703 via the conductive via 896 and at least one bonding wire 631. The elements on the top surface of IC 803 may include an HBT amplifier circuit such as HBT amplifier circuit 810 shown in FIG. 4. The IC 803 may be a backside-via type IC. A ground plane may be formed on the lower surface of the IC 803. In addition, the IC 803 may be electrically connected to a ground node of the IC 703 via the conductive via 896. Also, the elements formed on the top surface of the IC 703 may be electrically connected to a top surface of a substrate 903 via at least one bonding wire 632. In a representative embodiment, an epoxy resin may be formed between the IC 703 and the IC 803 and/or between the IC 703 and the substrate 903.

Figure 11:
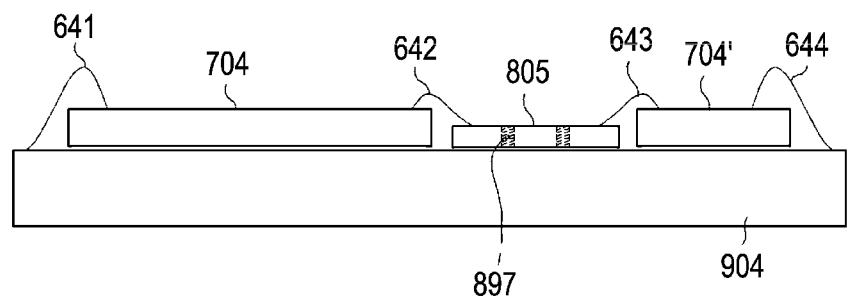
FIG. 11 illustrates a longitudinal sectional view showing a hybrid RF power amplifier, according to a representative embodiment.

FIG. 11 illustrates a longitudinal sectional view showing a hybrid RF power amplifier, according to a representative embodiment. Description of similar aspects and components as that described in connection with the representative embodiments of FIGS. 1A-10 may be omitted from the description of the representative embodiments described in connection with FIG. 11.

Referring to FIG. 11, the hybrid RF power amplifier according to this representative embodiment includes a first IC 704 (which may be characterized as a first device), a second IC 704' (which may be characterized as a third device) and an IC 805 (which may be characterized as a second device), all of which are mounted separately on a substrate 904.

The ICs 704, 704' may be fabricated from a semiconductor wafer (not shown in FIG. 11) suitable for CMOS processing and having CMOS devices formed thereover. As such, the first and second ICs 704, 704' comprise complimentary metal-oxide semiconductor (CMOS) devices. As an alternative, first and second ICs 704, 704' may be fabricated over a silicon on insulator (SOI) substrate (not shown in FIG. 11). The use of an SOI substrate may result in further improvement of performance of the RF power amplifier or other circuit blocks (such as RF switches) over the use of another substrate (e.g., a silicon substrate typically used in the CMOS applications).

The IC 805 may be formed from or over a semiconductor wafer (not shown in FIG. 11) suitable for processing to form HBTs thereover. In a representative embodiment, the semiconductor wafer may comprise one of a number of Group III-V semiconductor materials, such as, for example, gallium arsenide (GaAs).

In this representative embodiment, an IC such as IC 700 shown in FIG. 4 is separated into the first IC 704 and the second IC 704'. For example, an RF input stage, a CMOS amplifier circuit and an inter-stage impedance matching network such as RF input terminal 709 IN, CMOS amplifier circuit 710 and inter-stage impedance matching network 720 such as shown in FIG. 4 may be included in the first IC 704 shown in FIG. 11. Also, an output impedance matching network, a control circuit and a detector circuit such as output impedance matching network 730, control circuit 740 and detector circuit 750 as shown in FIG. 4 may be included in the second IC 704' shown in FIG. 11. It should also be understood that in other representative embodiments, the control circuit and the detector circuit may be included in the first IC 704 shown in FIG. 11.

The IC 805 shown in FIG. 11 is a backside-via type IC having at least one conductive via 897 electrically interconnecting the top surface and the lower surface of IC 805. Notably, the conductive via 796 comprise a material that is not only electrically conductive, but also is thermally conductive. While many metals and alloys suffice for these desired traits, other materials are contemplated. Beneficially, therefore, the conductive via 796 provides an electrical connection and a thermal connection.

Elements on the top surface of the IC 80, such as HBT amplifier circuit 810 shown in FIG. 4, may be electrically connected to the substrate 904 by the conductive via 897. Elements formed on the top surface of the IC 805 may be connected to the top surface of the first IC 704 and the top surface of the second IC 704' respectively via at least one bonding wire 642 and at least one bonding wire 643. A ground plane may be formed on the lower surface of the IC 805. In addition, the IC 805 can be electrically connected to a ground node of the substrate 904 via the conductive via 897. Also, the first IC 704 and the second IC 704' are electrically connected to the substrate 904 respectively via at least one bonding wire 641 and at least one bonding wire 644. In other representative embodiments, the first IC 704 may be replaced with an SOI IC and the second IC 704' may be replaced with an SOI IC or an IPD.

Figure 12:
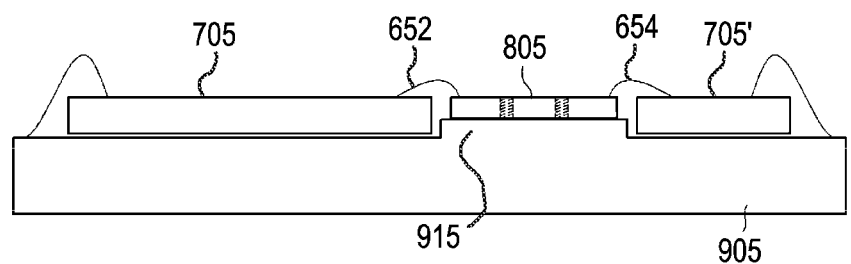
FIG. 12 illustrates a longitudinal sectional view showing a modification of the hybrid RF power amplifier shown in FIG. 11, according to a representative embodiment.

FIG. 12 illustrates a longitudinal sectional view showing a modification of the hybrid RF power amplifier shown in FIG. 11, according to a representative embodiment. Description of similar aspects and components as that described in connection with the representative embodiments of FIGS. 1A-11 may be omitted from the description of the representative embodiments described in connection with FIG. 12.

Referring to FIG. 12, the hybrid RF power amplifier according to this representative embodiment includes a first IC 705, a second IC 705' and an IC 805, all of which are mounted on a substrate 905. First IC 705, second IC 705' and IC 805 respectively correspond to and are substantially the same as first IC 704, second IC 704' and IC 805 shown in FIG. 11, and further descriptions of these elements are omitted from the following. The first IC 705 is electrically connected to IC 805 via at least one bonding wire 652, and second IC 705' is electrically connected to IC 805 via at least one bonding wire 654.

In this representative embodiment as shown in FIG. 12, the IC 805 is mounted on a stepped portion 915 of the substrate 905, so that a top surface of the IC 805 may be substantially at a same relative level as top surfaces of first IC 705 and second IC 705'. As a result, the length of bonding wires 652 and 654 may be shortened, consequently and beneficially reducing the inductance of the bondwires. The stepped portion 915 also provides and fosters control of the flow of liquid die attach material (not shown) during assembly of the hybrid RF power amplifier.

Figure 13:
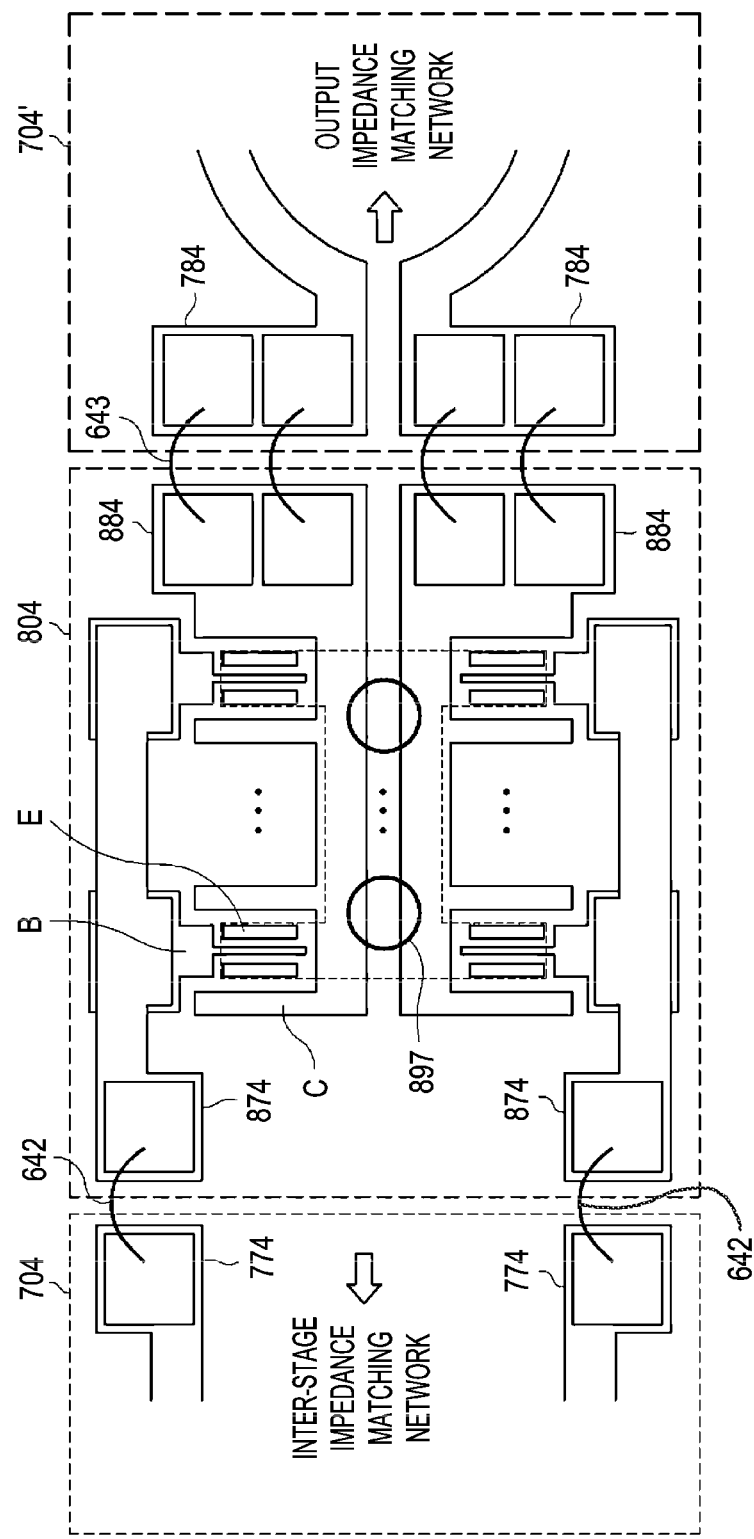
FIG. 13 illustrates a diagram showing engagement between an IC and a IC of the hybrid RF power amplifier shown in FIG. 11, according to a representative embodiment.

FIG. 13 illustrates a diagram showing engagement between an IC and an IC of the hybrid RF power amplifier shown in FIG. 11, according to a representative embodiment. Description of similar aspects and components as that described in connection with the representative embodiments of FIGS. 1A-12 may be omitted from the description of the representative embodiments described in connection with FIG. 13.

Referring to FIG. 13, as shown an output stage 774 of the inter-stage impedance matching network (such as inter-stage impedance matching network 720 shown in FIG. 4 for example) of the first IC 704 may be electrically connected to an input stage 874 of the HBT amplifier circuit of the IC 805 via bonding wires 642. The output stage 774 may include a plurality of bonding pads that may be substantially square-shaped as shown, or which may be of any various shape in other representative embodiments. In addition, an output stage 884 of the HBT amplifier circuit of the IC 805 may be electrically connected to an input stage 784 of the output impedance matching network (such as output impedance matching network 730 shown in FIG. 4 for example) of the second IC 704' via bonding wires 643. The input stage 784 may include a plurality of bonding pads that may be substantially square-shaped as shown, or which may be of any various shape in other representative embodiments. In this representative embodiment shown in FIG. 13 and as described with reference to FIG. 11, the first IC 704, the second IC 704' and the IC 805 are mounted separately over a substrate such as substrate 904 shown in FIG. 11. The IC 805 is mounted in between the first IC 704 and the second IC 704'. In other representative embodiments, the positions of the first IC 704, the second IC 704' and the IC 805 as mounted separately on the substrate may be changed. Elements formed on the top surface of the IC 805 may be electrically connected to the top surface of substrate 904 via the conductive via 897.

Figure 14:
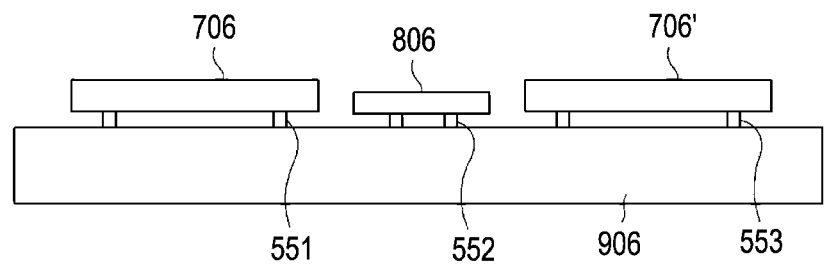
FIG. 14 illustrates a longitudinal sectional view showing a hybrid RF power amplifier, according to another representative embodiment.

FIG. 14 illustrates a longitudinal sectional view showing a hybrid RF power amplifier, according to another representative embodiment. Description of similar aspects and components as that described in connection with the representative embodiments of FIGS. 1A-13 may be omitted from the description of the representative embodiments described in connection with FIG. 14.

Referring to FIG. 14, the hybrid RF power amplifier according to this representative embodiment includes first IC 706, second IC 706', IC 805 and substrate 906. In this representative embodiment, elements of first IC 706 are formed on or over the lower surface of first IC 706, and elements of second IC 706' are formed on or over the lower surface of second IC 706'. Also, elements of IC 805 are formed on or over the lower surface of IC 805, which may be characterized as a flip-chip type IC. For example, an RF input stage, a CMOS amplifier circuit and an inter-stage impedance matching network such as RF input terminal 709 IN, CMOS amplifier circuit 710 and inter-stage impedance matching network 720 such as shown in FIG. 4 may be included in the first IC 706 shown in FIG. 14. Also, an output impedance matching network, a control circuit, a detector circuit and an RF output stage such as output impedance matching network 730, control circuit 740, detector circuit 750 and RF output terminal 712 OUT as shown in FIG. 4 may be included in the second IC 706' shown in FIG. 14. The first IC 706 may be electrically connected to the substrate 906 via at least one conductive (e.g., copper or other suitable electrically conductive material) pillar 551. In accordance with a representative embodiment, the pillar 551 comprises a material that is not only electrically conductive, but also is thermally conductive. While many metals and alloys suffice for these desired traits, other materials are contemplated. The second IC 706' may be electrically connected to substrate 906 via at least one conductive (e.g., copper or other suitable electrically conductive material) pillar 553. In accordance with a representative embodiment, the pillar 553 comprises a material that is not only electrically conductive, but also is thermally conductive. While many metals and alloys suffice for these desired traits, other materials are contemplated.

Figure 15:
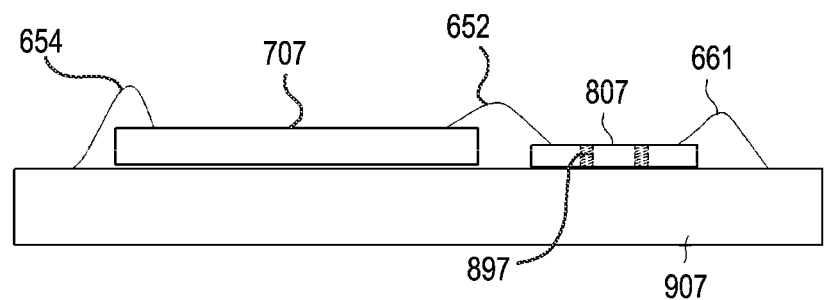
FIG. 15 illustrates a longitudinal sectional view showing a hybrid RF power amplifier, according to a still further representative embodiment.

FIG. 15 illustrates a longitudinal sectional view showing a hybrid RF power amplifier, according to a still further representative embodiment. Description of similar aspects and components as that described in connection with the representative embodiments of FIGS. 1A-14 may be omitted from the description of the representative embodiments described in connection with FIG. 15.

Referring to FIG. 15, the hybrid RF power amplifier according to this representative embodiment includes an IC 707, an IC 807 and a substrate 907. In this representative embodiment, elements of IC 707 are formed on or over a top surface of IC 707, and elements of IC 807 are formed on or over a top surface of IC 807. For example, an RF input stage, a CMOS amplifier circuit, an inter-stage impedance matching network, a control circuit and a detector circuit such as RF input terminal 709 IN, CMOS amplifier circuit 710, inter-stage impedance matching network 720, control circuit 740 and detector circuit 750 such as shown in FIG. 4 may be included in the IC 707 shown in FIG. 15. Also, an output impedance matching network and an RF output stage such as output impedance matching network 730 and RF output terminal 712 OUT as shown in FIG. 4 may be provided in substrate 907 shown in FIG. 15. The IC 707 and the IC 807 are mounted separately on substrate 907. IC 807 may be directly connected to a substrate 907 via at least one bonding wire 661. Elements formed on the top surface of the IC 807 may also be electrically connected to the top surface of substrate 906 via the at least one conductive via 897. Also, elements formed on the top surface of the IC 807 may be connected to the top surface of the IC 707 via at least one bonding wire 652. In this representative embodiment, an output stage of an HBT amplifier circuit included in the IC 807 is electrically connected to an input stage of the output impedance matching network included in the substrate 907 via bonding wires 661. The RF output stage (not shown) provided in the substrate 907 may be connected to an output stage of the output impedance matching network. The control circuit (not shown) as included in IC 707 may be configured to control the HBT amplifier circuit included in the IC 807. Also, at least one bonding wire 654 may be included to electrically connect the top surface of IC 707 and the top surface of substrate 907. In other representative embodiments, it should be understood that the IC 807 may be electrically connected to the substrate 907 via a copper pillar (conductive pillar).

Figure 16:
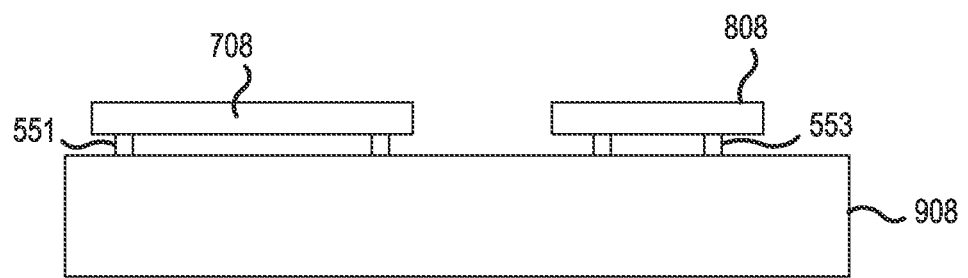
FIG. 16 illustrates a longitudinal sectional view showing a hybrid RF power amplifier, according to a still further representative embodiment.

FIG. 16 illustrates a longitudinal sectional view showing a hybrid RF power amplifier, according to a still further representative embodiment. Description of similar aspects and components as that described in connection with the representative embodiments of FIGS. 1A-15 may be omitted from the description of the representative embodiments described in connection with FIG. 16.

Referring to FIG. 16, the hybrid RF power amplifier according to this representative embodiment includes IC 708, IC 808 and substrate 908. In this representative embodiment, elements of IC 708 are formed on or over the lower surface of IC 708. Elements of IC 808 are formed on or over the lower surface of IC 808, which may be characterized as a flip-chip type IC. The IC 708 and the IC 808 are mounted separately on or over substrate 908. For example, an RF input stage, a CMOS amplifier circuit, an inter-stage impedance matching network, a control circuit, a detector circuit, an output impedance matching network and an RF output stage such as RF input terminal 709 IN, CMOS amplifier circuit 710, inter-stage impedance matching network 720, control circuit 740, detector circuit 750, output impedance matching network 730 and RF output terminal 712 OUT such as shown in FIG. 4 may be included in the IC 708 shown in FIG. 16. The IC 708 may be electrically connected to the substrate 908 via at least one pillar 551. The IC 808 may be electrically connected to the substrate 908 via pillars 553. Also, the elements of IC 708 may be electrically connected to IC 808 via pillars 551 and pillars 553.

Figure 17:
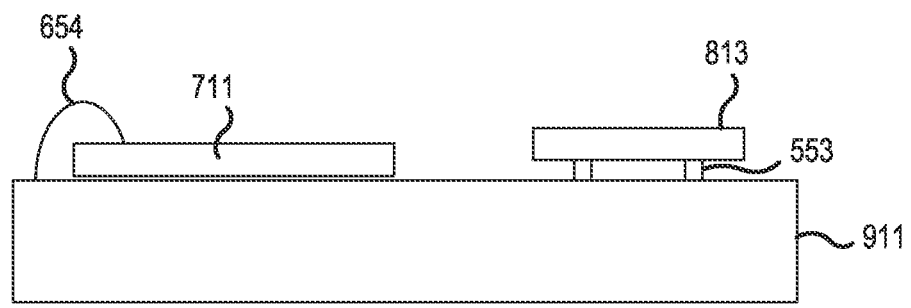
FIG. 17 illustrates a longitudinal sectional view showing a hybrid RF power amplifier, according to a still further representative embodiment.

FIG. 17 illustrates a longitudinal sectional view showing a hybrid RF power amplifier, according to a still further representative embodiment. Description of similar aspects and components as that described in connection with the representative embodiments of FIGS. 1A-16 may be omitted from the description of the representative embodiments described in connection with FIG. 17.

Referring to FIG. 17, the hybrid RF power amplifier according to this representative embodiment includes an IC 711, an IC 813 and a substrate 911. In this representative embodiment, elements of IC 711 are formed on or over a top surface of IC 711. Elements of IC 814 are formed on or over a lower surface of IC 813, which may be characterized as a flip-chip type IC. For example, an RF input stage, a CMOS amplifier circuit, an inter-stage impedance matching network, a control circuit and a detector circuit such as RF input terminal 709 IN, CMOS amplifier circuit 710, inter-stage impedance matching network 720, control circuit 740 and detector circuit 750 such as shown in FIG. 4 may be included in the IC 711 shown in FIG. 17. Also, an output impedance matching network and an RF output stage such as output impedance matching network 730 and RF output terminal 712 OUT as shown in FIG. 4 may be provided in substrate 911 shown in FIG. 17. The IC 711 and the IC 813 are mounted separately on or over substrate 911. The IC 813 may be electrically connected to the substrate 911 via pillars 553. Elements formed on the top surface of the IC 711 may be electrically connected to the top surface of substrate 911 via the at least one bonding wire 654. In this representative embodiment, an output stage of an HBT amplifier circuit included in the IC 813 may be electrically connected to an input stage of the output impedance matching network included in the substrate 911 via pillars 553. The RF output stage (not shown) provided in the substrate 911 may be connected to an output stage of the output impedance matching network. The control circuit (not shown) as included in IC 711 may be configured to control the HBT amplifier circuit included in the IC 814 via bonding wires 654 and pillars 553.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

While the invention has been shown and described with respect to the preferred embodiments, it will be understood by those skilled in the art that various changes and modifications may be made without departing from the scope of the invention as defined in the following claims.

What is claimed is:

1. A hybrid radio frequency (RF) power amplifier comprising:
    a first device disposed over a substrate, the first device comprising an RF input terminal, an RF output terminal, a pre-driver stage configured to amplify an RF input signal received via the RF input terminal, a first matching network, a second matching network, and a control circuit; and
    a second device disposed over the first device, the second device comprising a heterojunction bipolar transistor (HBT) amplifier circuit, the HBT amplifier circuit being controlled by the control circuit;
    an electrical and thermal connection between the first device and the second device; and
    an electrical and thermal connection between the first device and the substrate, the electrical and thermal connection comprising a pillar disposed between a lower surface of the second device and an upper surface of the first device.

2. The hybrid RF power amplifier as claimed in claim 1, wherein the electrical and thermal connection comprises a thermally and electrically conductive material disposed between a lower surface of the second device and an upper surface of the first device.

3. The hybrid RF power amplifier of claim 1, wherein the HBT amplifier circuit is configured to amplify an output of the first matching network.

4. The hybrid RF power amplifier of claim 2, wherein an output of the HBT amplifier circuit is supplied to the second matching network, and the first matching network is electrically connected between the pre-driver stage and the HBT amplifier circuit.

5. The RF amplifier of claim 3, wherein the second matching network is electrically connected between the HBT amplifier circuit and an RF output stage, and the control circuit being configured to control the HBT amplifier circuit.

6. The hybrid RF power amplifier of claim 1, wherein the HBT amplifier circuit is disposed over a lower surface of the second device, the pre-driver stage of the first device is disposed over a lower surface of the first device, and the lower surface of the second device faces an upper surface of the first device.

7. A hybrid radio frequency (RF) power amplifier comprising:
    a first device disposed over a substrate, the first device comprising an RF input terminal, an RF output terminal, a pre-driver stage configured to amplify an RF input signal received via the RF input terminal, a first matching network, a second matching network, and a control circuit;
    a second device disposed over the first device, the second device comprising a heterojunction bipolar transistor (HBT) amplifier circuit, the HBT amplifier circuit being controlled by the control circuit, and being is disposed over a lower surface of the second device, wherein the pre-driver stage of the first device is disposed over a lower surface of the first device, and the lower surface of the second device faces an upper surface of the first device;
    an electrical and thermal connection between the second device and the substrate; and
    a first pillar between a conductive via and the second device, and a second pillar between the conductive via and the substrate.

8. The hybrid RF power amplifier as claimed in claim 7, wherein the electrical and thermal connection comprises at least one first through hole with a conductive via therein.

9. The hybrid RF power amplifier of claim 7, wherein the HBT amplifier circuit is configured to amplify an output of the first matching network.

10. The hybrid RF power amplifier of claim 9, wherein an output of the HBT amplifier circuit is supplied to the second matching network, and the first matching network is electrically connected between the pre-driver stage and the HBT amplifier circuit.

11. The RF amplifier of claim 10, wherein the second matching network is electrically connected between the HBT amplifier circuit and an RF output stage, and the control circuit being configured to control the HBT amplifier circuit.

12. A hybrid radio frequency (RF) power amplifier comprising:
    a first device disposed over a substrate, the first device comprising an RF input terminal, an RF output terminal, a pre-driver stage configured to amplify an RF input signal received via the RF input terminal, a first matching network, a second matching network, and a control circuit;
    a second device disposed over the first device, the second device comprising a heterojunction bipolar transistor (HBT) amplifier circuit, the HBT amplifier circuit being controlled by the control circuit, and being disposed over a lower surface of the second device, wherein the pre-driver stage of the first device is disposed over an upper surface of the first device, and the lower surface of the second device faces the upper surface of the first device;
    an electrical and thermal connection between the second device and the substrate; and
    a first pillar between a conductive via and the second device, and a second pillar between the conductive via and the substrate.

13. The hybrid RF power amplifier of claim 12, wherein the conductive via is a first conductive via and the first device further comprises at least one second through-hole with a second conductive via therein, and the second conductive via is configured to provide electrical connection between the second device and the pre-driver stage of the first device.

14. The hybrid RF power amplifier of claim 13, further comprising a first pillar between the second conductive via and the second device.

15. The hybrid RF power amplifier of claim 12, further comprising at least one third pillar between the first device and the second device.

16. The hybrid RF power amplifier of claim 12, wherein the conductive via is a first conductive via, and the first device further comprises at least one second through-hole with a second conductive via therein, the second conductive via configured to provide electrical connection between the substrate and the pre-driver stage of the first device.

17. The hybrid RF power amplifier of claim 16, further comprising at least one third pillar between the second conductive via and the substrate.

18. The hybrid RF power amplifier of claim 7, wherein the first device is provided in or over a silicon substrate and the second device is provided in or over a Group III-V substrate.

19. The hybrid RF power amplifier of claim 7, wherein the Group substrate is a gallium arsenide (GaAs) substrate.

20. The hybrid RF power amplifier of claim 7, wherein the first device comprises a complementary metal-oxide silicon (CMOS) device.

21. The hybrid RF power amplifier of claim 7, wherein the first device is provided in or over a silicon-on-insulator (SOI) substrate.

22. A radio frequency (RF) power amplifier comprising:
a first device comprising an RF input terminal, an RF output terminal, a pre-driver stage configured to amplify an RF input signal received via the RF input terminal, a first matching network, a second matching network, and a control circuit, the pre-driver stage of the first device being disposed over a upper surface of the first device;
a second device comprising a heterojunction bipolar transistor (HBT) amplifier circuit disposed over a upper surface of the second device;
a substrate,
an electrical and thermal connection between the first device and the second device, and comprising a pillar disposed between a lower surface of the second device and an upper surface of the first device;
wherein the first matching network is electrically connected between the pre-driver stage and the HBT amplifier circuit, the second matching network is electrically connected between the HBT amplifier circuit and the RF output terminal, and the control circuit is configured to control the HBT amplifier circuit, and wherein the HBT amplifier circuit is configured to amplify an output of the first matching network, an output of the HBT amplifier circuit is supplied to the second matching network, the second device is disposed over the first device, the first device is disposed over the substrate, and a lower surface of the second device opposes the upper surface of the first device.

23. The hybrid RF power amplifier as claimed in claim 22, wherein the electrical and thermal connection comprises a thermally and electrically conductive material disposed between a lower surface of the second device and an upper surface of the first device.

24. The hybrid RF power amplifier of claim 22, wherein the second device further comprises at least one first through-hole with a conductive via therein, and the conductive via is configured to provide an electrical connection between the HBT amplifier circuit and the pre-driver stage of the first device.

25. The hybrid RF power amplifier of claim 22, further comprising bonding wires configured to provide electrical connection between the upper surface of the first device and the upper surface of the second device.

26. The hybrid RF power amplifier of claim 22, further comprising bonding wires configured to provide electrical connection between the upper surface of the first device and an upper surface of the substrate.

27. The hybrid RF power amplifier of claim 22, wherein the first device is provided in or over a silicon substrate and the second device is provided in or over a gallium arsenide (GaAs) substrate.

28. The hybrid RF power amplifier of claim 22, wherein the first device comprises a complementary metal-oxide silicon (CMOS) device.

29. The hybrid RF power amplifier of claim 22, wherein the first device is provided in or over a silicon-on-insulator (SOI) substrate.

30. A radio frequency (RF) power amplifier comprising:
a first device comprising an RF input stage, a pre-driver stage configured to amplify an RF input signal received via an RF input terminal, and a first matching network, the RF input stage, the pre-driver stage of the first device being disposed over an upper surface of the first device;
a second device comprising a heterojunction bipolar transistor (HBT) amplifier circuit disposed over an upper surface of the second device, wherein the first matching network is electrically connected between the pre-driver stage and the HBT amplifier circuit;
a third device comprising an RF output terminal, a second matching network electrically connected between the HBT amplifier circuit and the RF output terminal, and a control circuit configured to control the HBT amplifier circuit;
a substrate,
a first pillar between a conductive via and the substrate; and
second conductive pillars between the first device and the substrate, and third conductive pillars between the third device and the substrate, wherein the HBT amplifier circuit is configured to amplify an output of the first matching network, an output of the HBT amplifier circuit is supplied to the second matching network, and the first, second and third devices are each separately disposed over the substrate.

31. The hybrid RF power amplifier of claim 30, wherein the second device further comprises at least one first through-hole with a conductive via therein, the conductive via configured to provide electrical connection between the HBT amplifier circuit and the substrate.

32. The hybrid RF power amplifier of claim 30, further comprising bonding wires configured to electrically connect the first and third devices to the second device.

33. The hybrid RF power amplifier of claim 30, further comprising bonding wires configured to electrically connect the first and third devices to the substrate.

34. The hybrid RF power amplifier of claim 30, wherein the substrate comprises a stepped portion, the second device is disposed over the stepped portion, and the upper surface of the second device is substantially at a same relative level as the upper surfaces of the first and third devices.

35. The hybrid RF power amplifier of claim 30, wherein the first device is provided in or over a silicon substrate and the second device is provided in or over a gallium arsenide (GaAs) substrate.

36. The hybrid RF power amplifier of claim 30, wherein the first device comprises a complementary metal-oxide silicon (CMOS) device.

37. The hybrid RF power amplifier of claim 30, wherein the first device is provided in or over a silicon-on-insulator (SOI) substrate.

38. A radio frequency (RF) power amplifier comprising:
a first device comprising an RF input terminal, a pre-driver stage configured to amplify an RF input signal received via the RF input stage, a first matching network, and a control circuit, the RF input terminal, the pre-driver stage and the RF input stage of the first device being disposed over a upper surface of the first device;
a second device comprising a heterojunction bipolar transistor (HBT) amplifier circuit disposed over a upper surface of the second device;
a substrate comprising an RF output terminal, and a second matching network electrically connected between the HBT amplifier circuit and the RF output terminal, the terminal and circuit of the substrate disposed over a upper surface of the substrate;
first bonding wires configured to electrically connect the upper surface of the second device to the substrate; and
a conductive pillar disposed between a conductive via and the substrate, wherein the first matching network is electrically connected between the pre-driver stage and the HBT amplifier circuit, the control circuit is configured to control the HBT amplifier circuit, the HBT amplifier circuit is configured to amplify an output of the first matching network, an output of the HBT amplifier circuit is supplied to the second matching network, and the first and second devices are separately disposed over the substrate.

39. The hybrid RF power amplifier of claim 38, further comprising an electrical and thermal connection between the HBT amplifier circuit and the substrate.

40. The hybrid RF power amplifier of claim 39, wherein the electrical and thermal connection comprises at least one first through-hole with a conductive via therein disposed in the second device.

41. The hybrid RF power amplifier of claim 38, further comprising second bonding wires configured to electrically connect the upper surface of the first device to the upper surface of the second device, and third bonding wires configured to electrically connect the upper surface of the first device to the substrate.

42. The hybrid RF power amplifier of claim 38, wherein the first device is provided in or over a silicon substrate and the second device is provided in or over a gallium arsenide (GaAs) substrate.

43. The hybrid RF power amplifier of claim 38, wherein the first device comprises a complementary metal-oxide silicon (CMOS) device.

44. The hybrid RF power amplifier of claim 38, wherein the first device is provided in or over a silicon-on-insulator (SOI) substrate.

* * * * *